United States Patent [19]
Van Etten et al.

[11] Patent Number: 5,357,253
[45] Date of Patent: Oct. 18, 1994

[54] SYSTEM AND METHOD FOR EARTH PROBING WITH DEEP SUBSURFACE PENETRATION USING LOW FREQUENCY ELECTROMAGNETIC SIGNALS

[75] Inventors: Paul Van Etten, Clinton; Russell D. Brown, Holland Patent, both of N.Y.

[73] Assignee: Earth Sounding International, Marina Del Ray, Calif.

[21] Appl. No.: 42,395

[22] Filed: Apr. 2, 1993

[51] Int. Cl.$^5$ .................. G01S 13/24; G01S 7/292
[52] U.S. Cl. ..................... 342/22; 342/131
[58] Field of Search .............. 342/22, 131, 132, 130, 342/200, 201, 202, 203

[56] References Cited

U.S. PATENT DOCUMENTS

| | | | |
|---|---|---|---|
| 1,838,371 | 12/1931 | Deardorff | 342/22 |
| 2,139,460 | 12/1938 | Potapenko | 342/22 |
| 2,517,951 | 8/1950 | Wheeler | 342/22 X |
| 2,901,689 | 8/1959 | Barret et al. | 342/22 |
| 3,351,936 | 11/1967 | Feder | 342/22 |
| 3,896,434 | 7/1975 | Sirven | 342/132 |
| 4,008,469 | 2/1977 | Chapman | 342/22 |
| 4,218,678 | 8/1980 | Fowler et al. | 342/22 |
| 4,504,833 | 3/1985 | Fowler et al. | 342/22 |
| 4,691,204 | 9/1987 | Hiramoto | 342/22 |
| 4,853,701 | 8/1989 | Drabowitch | 342/139 |
| 4,937,580 | 6/1990 | Wills | 342/22 |
| 5,113,192 | 5/1992 | Thomas | 342/22 |
| 5,130,711 | 7/1992 | Kimura et al. | 342/22 |

Primary Examiner—John B. Sotomayor
Attorney, Agent, or Firm—Mason, Fenwick & Lawrence, Popham, Haik, Schnobrich & Kaufman, Ltd.

[57] ABSTRACT

An earth probing system uses deep penetration of electromagnetic waves into soil and other media. Advantage is taken of the lower attenuation of radar waves in soil by frequencies of about three megahertz or less. Bursts of electromagnetic energy of various frequencies in this range are consecutively transmitted. The transmitting antenna is continuously tuned, so as to maintain resonance during each burst, allowing large circulating currents and high power output. In a receiving antenna system, a dual antenna arrangement is providing for obtaining improved reception. A corresponding dual antenna circuit employs "spatial notch filtering", automatic adjustment of antenna gain-frequency variations, as well as compensation for transmitter gain variation. The system may be implemented in a totally analog, totally digital, or hybrid manner. Preferably, a signal processing method detects and digitally samples signals reflected from subsurface layers and buried objects. The invention provides means for removing system distortions and interfering signals, for compensating for aliasing errors and frequency-dependent antenna gain and phase variations, and for avoiding masking errors introduced by strong reflections.

34 Claims, 14 Drawing Sheets

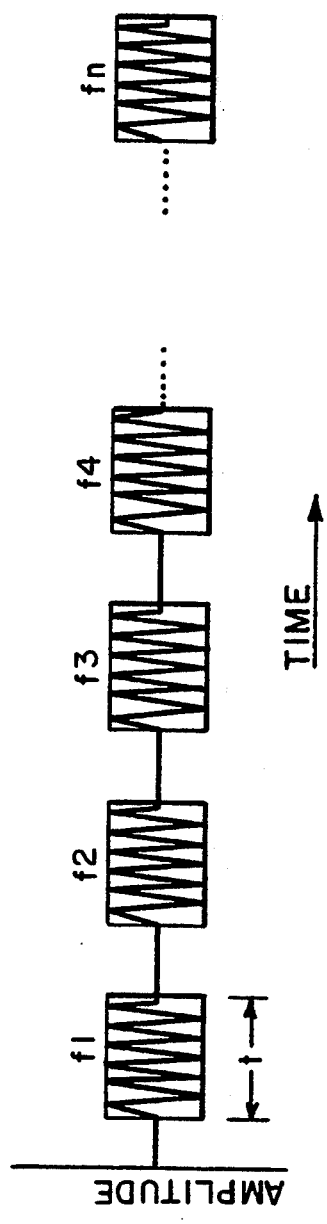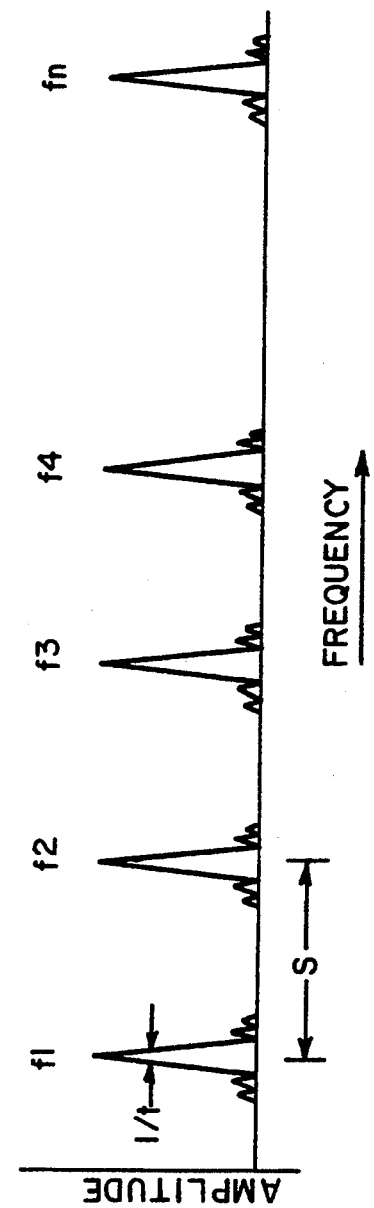

SYSTEM AND METHOD FOR EARTH PROBING WITH DEEP SUBSURFACE PENETRATION USING LOW FREQUENCY ELECTROMAGNETIC SIGNALS

BACKGROUND OF THE INVENTION

1. Field of the Invention

The present invention relates to earth probing systems. More specifically, the invention relates to earth probing systems using low frequency electromagnetic energy to provide detailed information regarding subsurface formations, especially such systems involving system distortion compensation, noise separation, interference removal, and recording, display and mapping of subsurface formations.

2. Related Art

Historically, seismic (sound) waves have been radiated into the earth to detect and map subsurface layers and buried objects. In the recent past, electromagnetic waves have been employed to produce similar detections and mapping. However, results have been limited to shallow ground penetration depths because of the extreme attenuation of the electromagnetic waves as they propagate through the earth. The attenuation of the electromagnetic wave varies drastically with frequency, as seen in TABLE 1.

TABLE 1

ATTENUATION OF RADAR ENERGY BY A LAYER OF BITUMINOUS COAL AS A FUNCTION OF RADAR FREQUENCY

| FREQUENCY | ONE WAY ATTENUATION (dB per Meter) |
|---|---|
| 250 KiloHertz | 0.005 |
| 500 KiloHertz | 0.01 |
| 1.0 MegaHertz | 0.02 |
| 5.0 MegaHertz | 0.10 |
| 25.0 MegaHertz | 0.50 |
| 100.0 MegaHertz | 2.00 |
| 500.0 MegaHertz | 10.00 |
| 1.0 GigaHertz | 20.00 |

An early example of an attempt to use radio frequency mapping is that of Deardorf (U.S. Pat. No. 1,838,371), who used relatively low power to identify subsurface anomalies in the earth. Potapenko (U.S. Pat. No. 2,139,460) calculated the ratio of absorption of two radio frequencies to identify oil and water deposits. Wheeler (U.S. Pat. No. 2,517,951) employed a wide band antenna, tuned inductively at several points along its length in an effort to transmit more energy into the earth from a radar transmitter. Feder (U.S. Pat. No. 3,351,936) employed two complete radar transmitters and receivers to achieve identification of subsurface reflections. Barret et al. (U.S. Pat. No. 2,901,689) used transmitting and receiving antennas at various angles of incidence and reflection to plot earth cross sections. Chapman (U.S. Pat. No. 4,008,469) employed short pulse, conventional radar equipment along with relatively sophisticated signal processing equipment for subsurface plotting. Fowler et al. (U.S. Pat. No. 4,504,833) uses a synthetic pulse made up of Fourier component frequencies in order to obtain more easily interpreted reflection signals. Thomas (U.S. Pat. No. 5,113,192) employs audio frequency seismic reflection data to help interpret the findings from a ground penetrating radar. Kimura et al. (U.S. Pat. No. 5,130,711) utilizes a polarization-advancing scheme to achieve recognition of signals reflected from underground formations. It is believed that no known systems can achieve penetrations to a depth of a mile, which is frequently required for oil/gas and mineral exploration.

Applicants have recognized that, to obtain electromagnetic wave subsurface maps to depths of one mile or more, the radiated frequency should be about 1-3 Megahertz or less. However, to obtain good resolution, the bandwidth should be as large as possible. To achieve both of the above goals, a large "percentage bandwidth" spectrum must be radiated into the earth. These two conflicting requirements, that of very low operating frequency and a wide percentage bandwidth, represent a challenging design problem for the radar antenna system designer.

As used herein, lower frequency electromagnetic spectrum may be generally divided into bands for the purpose of description, as shown in TABLE 2 (*Reference Data For Radio Engineers*, Sixth Edition, Howard W. Sams & Co., Inc., page 27-6.):

TABLE 2

NOMENCLATURE OF ELECTROMAGNETIC FREQUENCY BANDS

| DESIGNATION | FREQUENCY RANGE |
|---|---|
| ELF—Extremely Low Frequency | 3–300 Hz |
| VF—Voice Frequency | 300–3,000 Hz |
| VLF—Very Low Radio Frequency | 3–30 KHz |
| LF—Low Radio Frequency | 30–300 KHz |
| MF—Medium Frequency | 300–3,000 KHz |

Reception and processing of large-percentage-bandwidth signals using ELF, VF, VLF, LF, and MF electromagnetic waves necessary for earth probing radar systems, require unique instrumentation methods to overcome problems not adequately dealt with by known systems. These problems include proper waveform selection and generation, radiation, reception, and signal processing to detect and enhance subsurface returns. Also, short pulse and linear frequency-modulated pulse compression systems generate spurious signal components due to resonant ringing of the antenna and impedance matching system.

A further design problem has derived from the facts that low frequencies entail long wavelengths, and that antennas which are small compared to the radiated wavelength have very low efficiency and very low gain. Therefore, to use low frequencies would require use of either large antennas or use of high-magnitude currents. Large antennas are impractical, and high-magnitude currents have not been found in systems suitable for high resolution deep-earth probing.

Still another design problem, relating more specifically to signal reception, has derived from the facts that antennas which are small compared to the radiated wavelength have very low efficiency and very low receiving aperture area, and that radar receiving antennas generally display non-uniformity in their frequency response over the large percentage bandwidth required for high resolution earth probing applications. These applications require a high degree of isolation between the transmitting and receiving antennas, to provide adequate sensitivity to the much weaker subsurface return signals. This design problem has not been dealt with adequately in known systems.

Applicants have also recognized that transmission and reception of such signals require unique electrical properties in the antenna system, and special processing techniques for received signals. To achieve sufficient radiated power for ground penetration, a means of maintaining antenna efficiency across the entire operating band must be provided. Reliable detection and location of buried objects by a deep probing radar system further requires precise control and compensation of antenna phase and amplitude response, in order to perform sensitive signal processing operations on the received data.

The present invention embodies unique concepts for solving these and other problems which limit the performance of conventional pulsed radar systems when operating at low frequencies and large percent bandwidths. The novel, heretofore unknown, technology for radar operation in these frequency bands is the subject of the present invention.

SUMMARY OF THE INVENTION

The present invention relates to a system for overcoming the limitations of conventional radar systems which prevent them from operating in the low frequency regime described above. The foregoing problem areas are addressed and solved by the systems and methods of the present invention.

The preferred radar probing system according to the present invention includes a transmitter portion (with transmitting antenna), a receiver portion (with receiving antennas), and a signal processing portion. Each portion has novel features which provide advantages, even when not used in combination novel features of the other portions, so that no inference should be made that all features in this Summary or in any particular claim are required for patentability of any other claim.

The present invention addresses and solves the above-described design problem, that low frequencies entail long wavelengths, and that antennas which are small compared to the radiated wavelength have very low efficiency and very low gain. The approach taken in the present invention is to resonate a small antenna, thus providing high circulating currents which greatly enhance the intensity of the radiated electromagnetic radiation, thus allowing realization of the advantages of low frequency electromagnetic signals. The transmitter portion includes means for generating and transmitting electromagnetic energy in the form of a series of pulses, each pulse having energy of a certain frequency within a larger range of low frequencies capable of penetrating deep into the earth. In this manner, full use may be made of a substantial percentage of the desired bandwidth, while retaining the advantages of small antenna size and clear definition at great depths.

The receiver portion according to the present invention receives return signals reflected from subsurface layers and objects, removes distortion caused by direct path signals from the transmitter portion, and corrects non-uniformities in the received amplitude and phase response. "Spatial notching" is provided to reduce the direct path signal from the transmitter, and enhance subsurface returns relative to this unwanted signal. In addition, the invention compensates for variations in amplitude and phase response of the receiving antenna elements. The compensation system allows for variations in deployment and earth conditions in proximity to the receiving antennas. Both direct path signal removal, and compensation for antenna variations as a function of frequency, may be performed simultaneously.

Moreover, various signal processing methods may be used within the processing portion so as to ultimately provide users with clear, comprehensive representations of subsurface formations.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which:

FIG. 1 is a simplified timing diagram illustrating a discrete, stepped-frequency waveform which is used in a preferred embodiment of the present invention.

FIG. 2 illustrates the frequency spectrum of the stepped frequency radar pulse of FIG. 1.

DETAILED DESCRIPTION OF THE PREFERRED EMBODIMENTS

Figure 3:
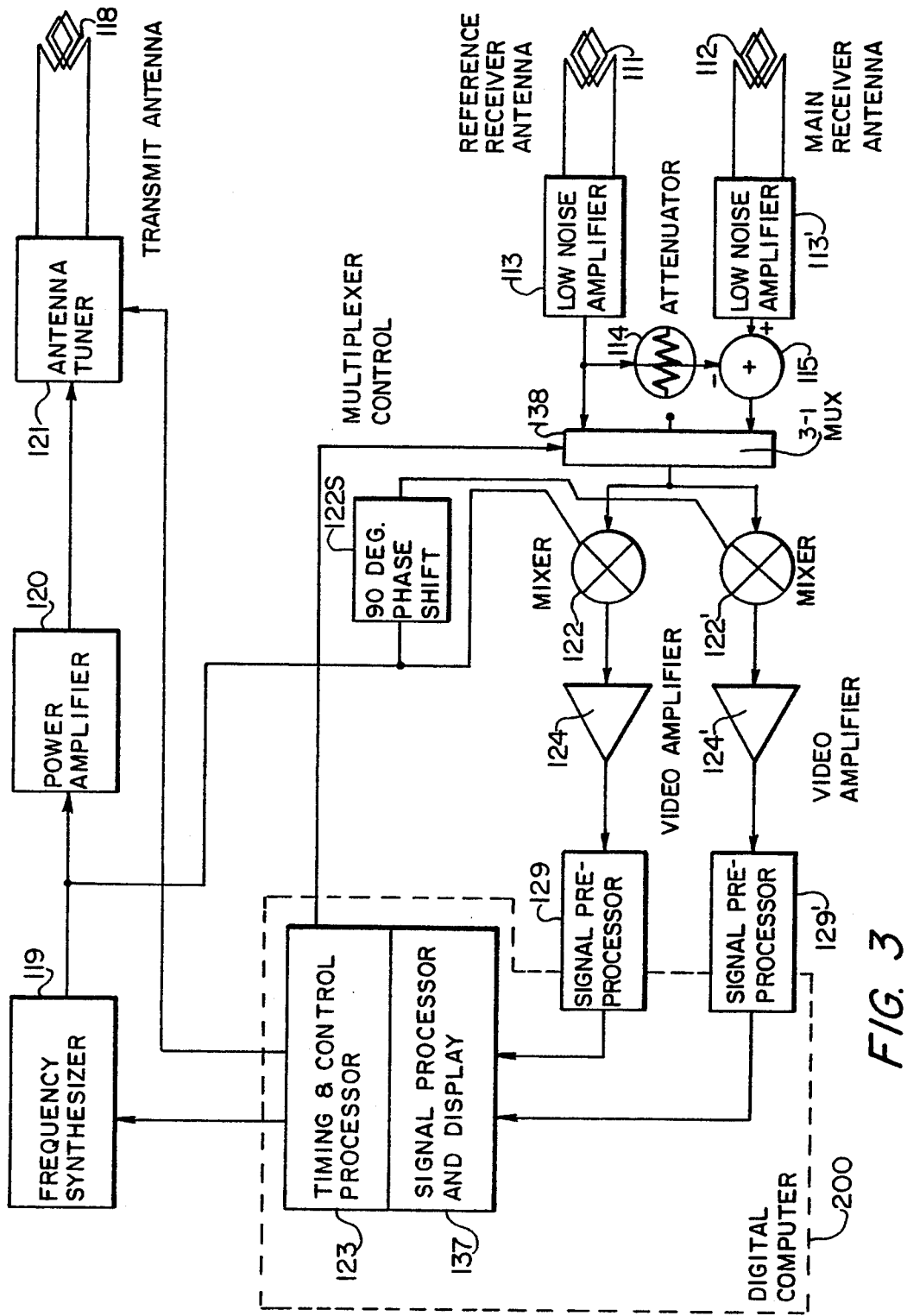
FIG. 3 is a block diagram of the stepped-frequency receiving and processing system according to a preferred embodiment of the present invention.

In describing preferred embodiments of the present invention illustrated in the drawings, specific terminology is employed for the sake of clarity. However, the invention is not intended to be limited to the specific terminology so selected, and it is to be understood that each specific element includes all technical equivalents which operate in a similar manner to accomplish a similar purpose. Further, elements, connections and operations readily understood and implemented by those skilled in the art are omitted when not needed for an understanding of essential features of the invention being claimed.

The present invention provides a means of overcoming the poor response of conventional pulsed radars when operating at low frequencies. In an approach according to the present invention, these phenomena are dealt with by a system and method of self-calibration and error removal. This solution permits use of high efficiency resonant antenna structures, as opposed to conventional resistive-swamped systems, to achieve the necessary wide bandwidths and reduced ringing.

The system according to the present invention is self-correcting to remove distortion introduced by circuit components and external sources of interference. Its preferred embodiment uses coherent (synchronous) detection and matched filtering in the receiver. Timing and control functions are preferably under computer control, and digital signal processing is advantageously used so as to achieve high resolution of range profiles.

As described in greater detail below, another aspect of the invention has addressed the problem of efficiently transmitting low frequency electromagnetic waves into the earth. Still another aspect of the invention provides unique methods of direct transmitter path leakage suppression in addition to removal of transmitter and receiver antenna gain variations, and effects due to proximity variations of the antennas with respect to the earth. In the inventive antenna system, to achieve sufficient radiated power for ground penetration, a means of maintaining antenna efficiency across the operating band is provided.

Moreover, reliable detection and location of buried objects by a deep probing radar system further requires precise control and compensation of antenna phase and amplitude response in order to perform sensitive signal processing operations on the measured data. To achieve this precision, the present invention provides dynamic calibration data through a reference channel in the radar receiver.

A novel feature of this invention is the use of a discrete stepped-frequency waveform, as shown in FIG. 1. The radar signal scans across the desired frequency bank in N discrete pulses, which (in the preferred embodiment) are pulsed electromagnetic signals equally spaced between frequency limits f1 and fn. Typical pulse widths are on the order of 50 milliseconds.

The unambiguous depth (range) coverage is given by:

$$R = \frac{CN}{2Bd}$$

where:

R is the range of unambiguous depth (or range) coverage;

C is the velocity of the electromagnetic wave in free space;

N is the number of discrete frequency steps;

B is the total bandwidth (B=fn−f1); and d is the index of refraction of the medium.

For typical values, such as N=256, B=500 kHz, d=3, the unambiguous depth (range) exceeds 16 miles, which is more than sufficient for most earth probing requirements. To achieve greater unambiguous depth, N can be increased and/or B can be decreased.

The frequency spectrum of the FIG. 1 radar signal is shown in FIG. 2. The majority of any wideband noise energy is removed by a matched filter described below which performs coherent integration, and selects only the energy contained in the radiated spectrum. The desired radar energy builds up to a sharp peak centered at each radiated frequency. For white noise, the signal to noise ratio improvement (I) provided by the system is:

$$I = St$$

where:

I is the signal to noise ratio improvement;

S is the frequency spacing given by S=B/(N−1); and t is the time duration of each discrete frequency step. Again, FIG. 1 shows a sequence of transmit frequencies and coherent integration intervals. In a typical example, the total bandwidth is 500 kHz, and the total time duration of the radiated signal is 5 minutes. This example provides the extremely high radiated energy required for deep-earth penetration.

Using the present concept in a typical earth probing radar implementation with a one kilowatt transmitter, the radiated energy per probing is 300,000 joules. This figure far exceeds that achieved by any other existing radar system designed for military or commercial applications. For example, the very large Ballistic Missile Early Warning System (BMEWS) radar used for missile and satellite tracking, (the AN/FPS-92), has a pulse energy of 10,000 joules, by comparison (*Radar Technology*, Eli Brookner, Artech House, Dedham, Mass. (1980), p. 28). The BMEWS radar is capable of detecting targets out to a range of 2,000 miles.

In addition to the large transmitter energy, the unique transmitted waveform provides the capability for pulse compression gain in the receiver, equal to the product of the transmitter time duration and the total bandwidth. For the example given in FIG. 1, this gain is 150 million, which also is much greater than that found in any known conventional radar system. The BMEWS pulse compression gain is 2,000, for comparison, as given in the article "A 1 GHz 2,000,000:1 Pulse Compression Radar-Conceptual System Design" by Haggerty, Meehan and O'Leary as published in *Radar Technology*, cited above. The inventive earth probing radar technique far exceeds the pulse compression ratio for an experimental technique given at p. 175.

Methods of generating the discrete frequency waveform include phase locked loop techniques, direct frequency synthesis, and numerically controlled oscillator techniques. Since the detection system of the preferred embodiment of the present invention utilizes the transmitted waveform as a phase reference (for a homodyne coherent phase detector), the absolute phase of the exciter need not be precisely controlled from one frequency step to the next. This greatly relieves the phase stability requirements of the waveform generator.

There are several additional advantages of using the discrete frequency waveform described above. These advantages include high pulse compression gain (equal to the square of the number of frequency steps), the ability to calibrate out system errors as they occur at each individual frequency, and the ability to perform long time coherent integration at each discrete frequency. Both pulse compression and coherent integration gain are obtained using this waveform and transmission scheme. Coherent integration, which is performed at each frequency step, greatly reduces interference from external sources such as power lines, manmade electromagnetic emitters, and natural phenomena such as cosmic and atmospheric noise.

FIG. 3 is a block diagram of a preferred embodiment of the present invention.

The transmitter waveform of FIG. 1 is generated by a frequency synthesizer 119 under control of a system timing and control processor 123, which selects the frequency and duration of each radiated pulse. The output from the frequency synthesizer 119 feeds a power amplifier 120, which raises the power to a level of (for example) one kilowatt. The amplified signal drives an antenna tuner 121 and a transmitting antenna 118.

The frequency synthesizer 119 also provides an output to a 90-degree phase shifter 122S, so as to provide in-phase and quadrature signals to mixers 122 and 122'. The output of the frequency synthesizer thus serves as a phase reference and local oscillator. The timing and control processor 123 also provides a control signal to a multiplexer 138, described below.

Energy from antenna 118 radiates into the earth and is reflected by subsurface targets. These reflections are then sensed by a reference receiving antenna 111 and main receiving antenna 112, as described in greater detail below. Briefly, the two antennas 111, 112 provide a means of separating and removing the direct path leakage from the transmitting antenna 118 to the receiving antennas, compensating for gain and phase variations in the antennas and transmitter, and removing unwanted antenna loading effects.

As shown in FIG. 3, the receiving system has two channels, one for the compensated signal from main receiving antenna 112, and one for detection of the reference channel from reference antenna 111. Low noise amplifiers 113, 113' are used in respective channels to establish the system signal-to-noise ratio, and raise the antenna signal levels to that required by the receiver mixers 122, 122'. A combiner (here a subtractor) 115 is disposed at the output of amplifier 113'. Combiner 115 receives at its non-inverting input the output of amplifier 113', and at its inverting input the output of an attenuator 114 whose input is in turn connected to the output of amplifier 113. The output of amplifier 113 and the output of combiner 115 are input to an analog 3-to-1 multiplexer 138. A third input to the multiplexer is not connected to an active signal, for reasons described in the following paragraph.

The signals derived from antennas 111, 112 are multiplexed into the mixers by means of the analog 3 to 1 multiplexer 138. This switch allows both channels to be turned off for measurement of DC bias introduced by A/D converters in signal pre-processors 129, 129' video amplifiers 124, 124', and/or mixers 122, 122'. Alternatively, either individual channel can be selected for data measurements. The analog multiplexer 138 is under control of the timing and control processor 123, preferably by a suitable software driven command signal.

Mixers 122, 122' provide in-phase and quadrature baseband signals to respective video amplifiers 124, 124'. In order to perform accurate system calibration and minimize errors, the preferred embodiment uses mixers as a synchronous detector. A single pair of mixers serves both the signal and reference channels in successive time frames, this sharing of the mixers being enabled by the analog multiplexer.

The video amplifiers provide outputs to the respective signal pre-processors 129, 129'.

Figure 4:
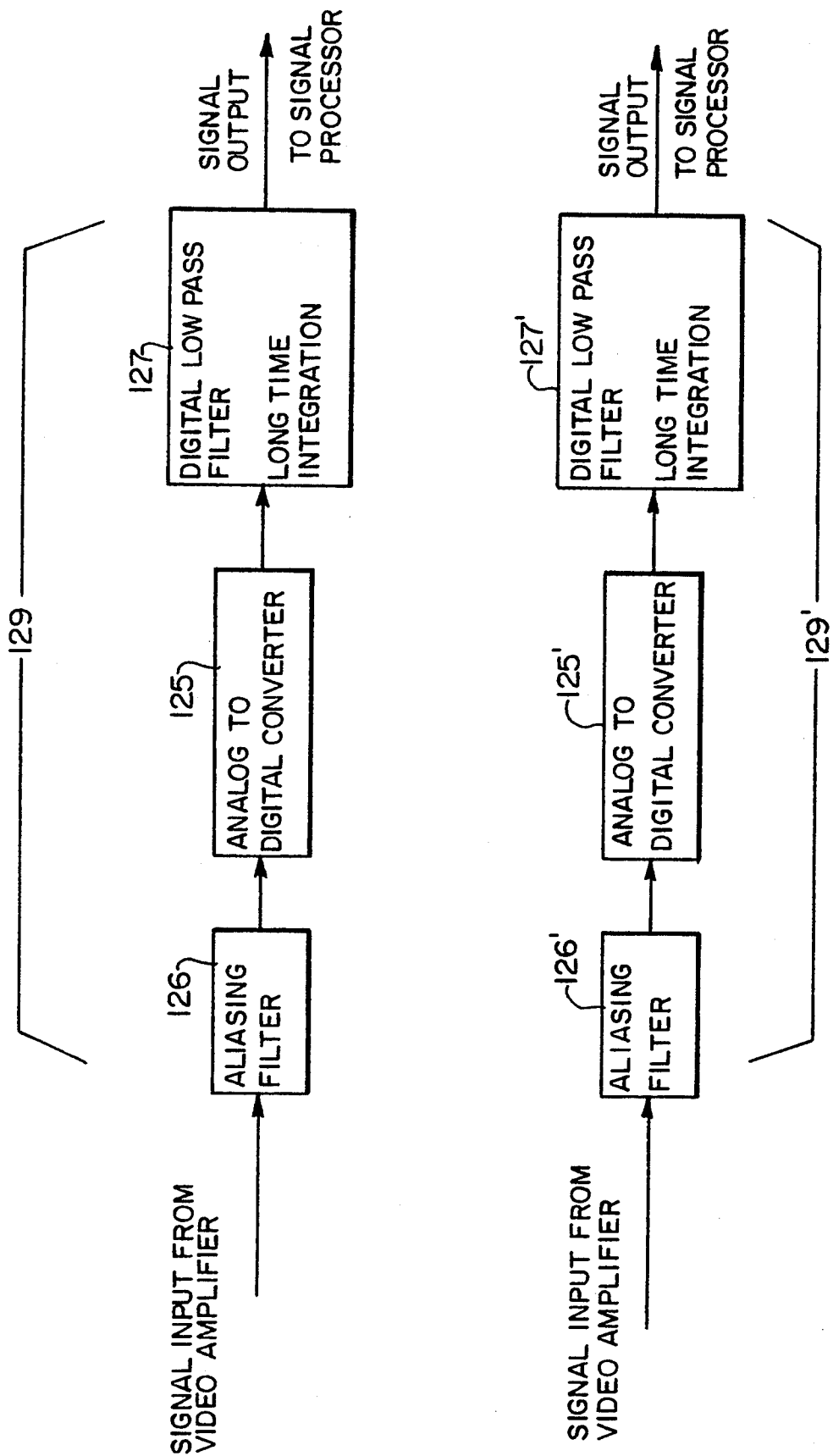
FIG. 4 is a block diagram of a signal pre-processor which is a component of the system shown in FIG. 3.

A preferred embodiment of the signal pre-processor 129 or 129' is illustrated in FIG. 4. The signal pre-processor includes, in sequence for each of the two respective I and Q channels, aliasing filters 126, 126' analog-to-digital converters 125, 125' (typically having 14 bit resolution), digital low pass filters 127, 127' providing long time coherent integration functions for operation during each frequency step. The coherent integrators are essentially matched filters matched to the frequency of the individual frequency pulses, so as to remove natural and man-made interference which would otherwise mask weak target returns. The digital filters 127, 127' as well as timing processor 123 and signal processor 137, may be part of a conventional digital computer 200.

Finally, the complex I and Q (in-phase and quadrature) digital data from the coherent integrators 127, 127' are fed to the signal processor and display element 137 (FIG. 3). The signal processor and display element 137 performs amplitude weighting, pulse compression, depth compensation, data recording, video output, and other functions as described in greater detail below.

Figure 5:
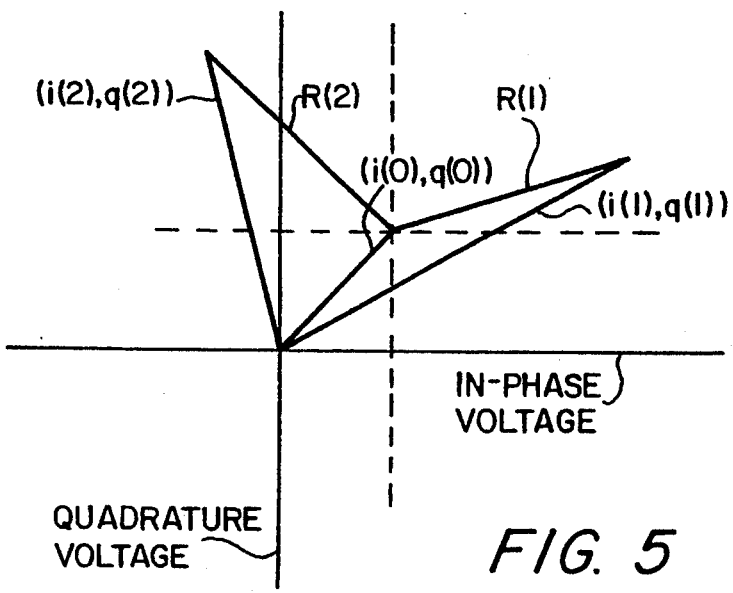
FIG. 5 illustrates operation of the vector calibrating and error removal unit which is part of the signal preprocessor of FIG. 4.
Figure 6:
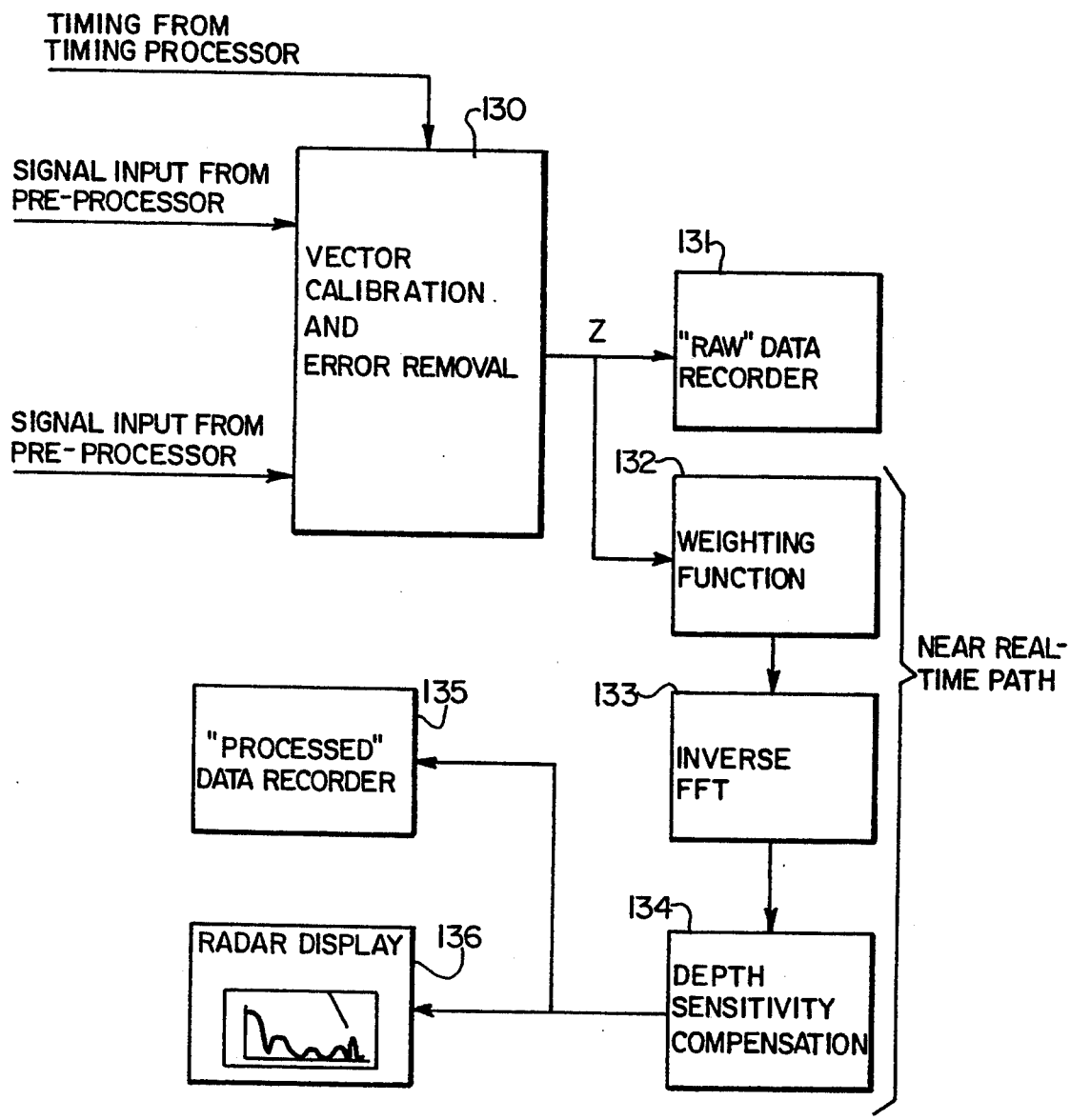
FIG. 6 is a block diagram of a preferred signal processing and display unit of the system.

In order to achieve the extremely low time (depth) side lobe levels necessary for detection of subsurface targets, the system's phase and amplitude characteristics are measured so that they can be "calibrated out" of the data in the signal channel. The reference channel provides the necessary calibration data. FIG. 5 is a vector diagram conceptually illustrating the calibration procedure, with FIG. 6 showing schematically the signal processor component which performs the procedure.

First, the transmitter is gated off, and the zero signal reference voltage is measured by the system. It is during this time in which the transmitter is gated off that the frequency synthesizer 119 is changed to the next pulse frequency and allowed to settle. The data from the analog-to-digital converters 125, 125' during this time period represents the DC offset of the mixers 122, 122' and video amplifiers 124, 124' (FIG. 3) This offset measurement is shown as the complex value [i(0), q(0)] in FIG. 5, and represents the origin (point (0,0)) for the following complex number operations.

In a next time period, the transmitter is gated on, and the signal from reference receiver antenna 111 is measured by the system and forms a complex representation of the reference channel. The reference measurement is shown as the complex value [i(1), q(1)] in FIG. 5. A vector calibration and error removal unit (within the signal processor and display unit 137, to be described with reference to FIG. 6) calculates a complex vector representation of the reference channel as, $$R(1) = [i(1), q(1)] - [i(0), q(0)]$$

R(1) is the vector resultant for the reference channel.

At the same time, with the transmitter gated on, a measurement of the signal channel is made by the system, as received from main receiving antenna 112. The signal measurement is shown as the complex value [i(2), q(2)] in FIG. 5. Vector calibration and error removal unit 130 (FIG. 6) then calculates a complex vector representation of the signal channel as, $$R(2) = [i(2), q(2)] - [i(0), q(0)]$$

R(2) is the resultant vector for the signal channel.

Finally, the vector calibration and error removal unit 130 compensates the signal channel resultant for the reference phase and amplitude variations, by performing a complex division. The final output of unit 130 is given by:

$$Z = R(2)/R(1)$$

where Z is the output of vector calibration and error removal element 130.

The foregoing vector operations are preferably performed digitally, using floating point representations of the complex data received from the signal pre-processors 129, 129' under timing control from timing processor 123.

Referring more specifically to FIG. 6, the data signal processor and display unit 137 (illustrated generally FIG. 3) is shown in more detail. The data signal processor and display unit 137 provides digital pulse compression and associated vector processing on the data output from the vector calibration and error removal unit 130.

In particular, "raw" coherent data may be recorded directly on a "raw" data recorder 131, for subsequent processing by alternative pulse compression methods, such as recently developed spectral estimation techniques. This is in contrast to a real-time (or near-real-time) data channel including elements 132, 133, 134.

In the real-time data channel a low side lobe weighting function 132 is applied to the data. Several low side lobe window functions are given in Oppenheim et al., *Digital Signal Processing*, Princeton-Hall, Inc., Englewood Cliffs, N.J. (1975), p. 242, such as the Hanning window (approximately −40 dB), and the Blackman window (greater than −60 dB). Side lobe control is important in order to prevent a strong surface return from competing with weak subsurface returns. Phase and amplitude instabilities of the radar determine the ultimate side lobe levels achievable. For this reason, the transmitter power amplifier, receiver, and antenna system must be exactly controlled and exhibit only correctable errors. Residual errors are removed by the various methods described in this specification, which enable the system to detect extremely weak subsurface returns.

After the low side lobe weighting, an Inverse Fast Fourier Transform (IFFT) function is performed in element 133, to convert the stepped frequency measurements to the time (and therefore, depth) domain. The IFFT element provides pulse compression and signal to noise ratio gain. Standard methods for digital IFFT computations are given by Oppenheim et al. at pp 284-336.

The IFFT provides additional discrimination against narrow band interfering signals, beyond that of the low pass filter described above. Such sources of interference will not accumulate at the output of the IFFT, and are dispersed across all of the output depth regions. The energy from desired subsurface reflections, on the other hand, are concentrated by the IFFT and are readily distinguished from such interference.

After the IFFT, a depth-sensitivity compensation element 134 performs compensation so as to reverse the effects of increasing attenuation with depth of penetration through the earth. The depth-sensitivity compensation is a time dependent gain function which amplifies the signal components from far depth regions to a greater extent than near depth regions.

Preferably, "elements" 132, 133, 134 are implemented in software on a conventional digital computer, although alternative implementations are contemplated to lie within the scope of the invention.

Depth profiles may be displayed on a video monitor 136 which is used as a real-time radar display, and may also be recorded as a video signal on a "processed" data recorder 135. By making several subsurface probings along the surface of the earth, a cross sectional representation of the area may be formed. The depth profiles are stacked to obtain a three dimensional image (amplitude as a function of depth and surface location). Various formats may be used to display the data; one example involves color-coding the intensity values.

The system as a whole having been described above, certain details are now described in greater detail. First, particular implementations at the transmitter portion are presented.

Figure 7:
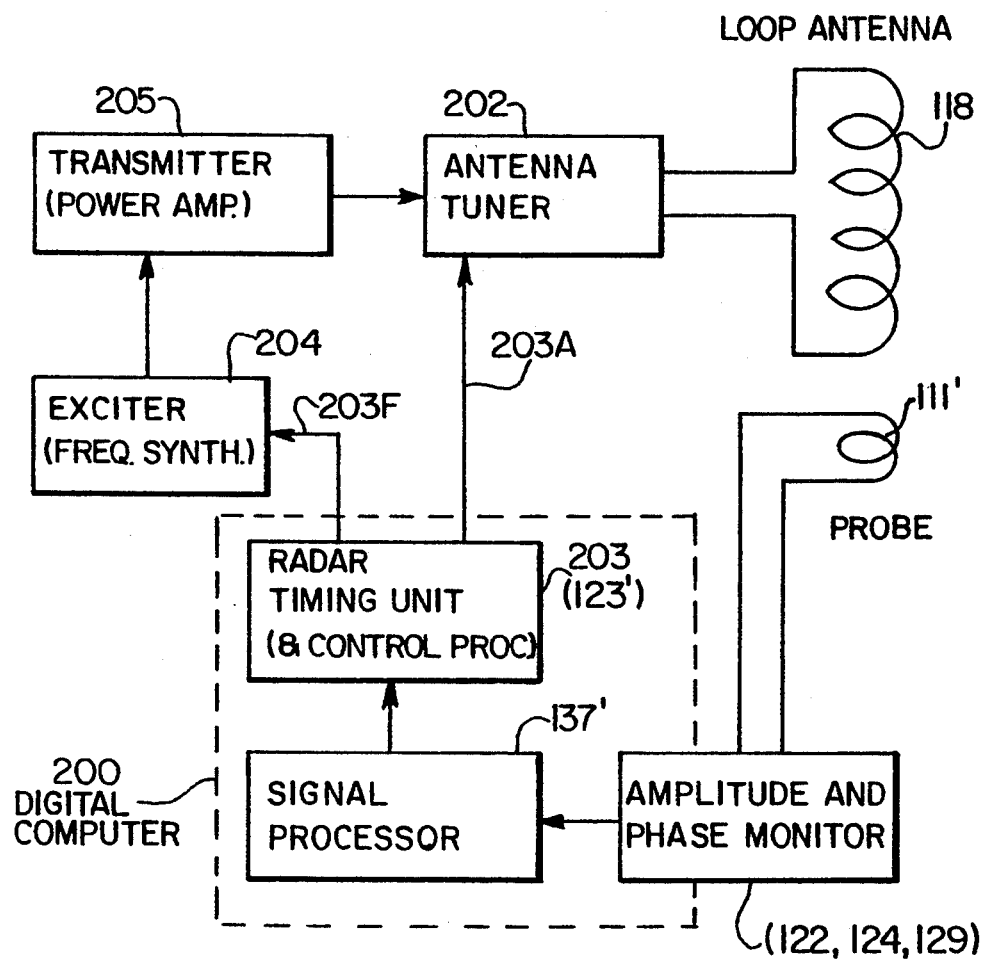
FIG. 7 is a block diagram of the transmitter portion including its transmitting antenna 118, also showing a probe antenna 111 used for compensation at the transmitting end.
Figure 8:
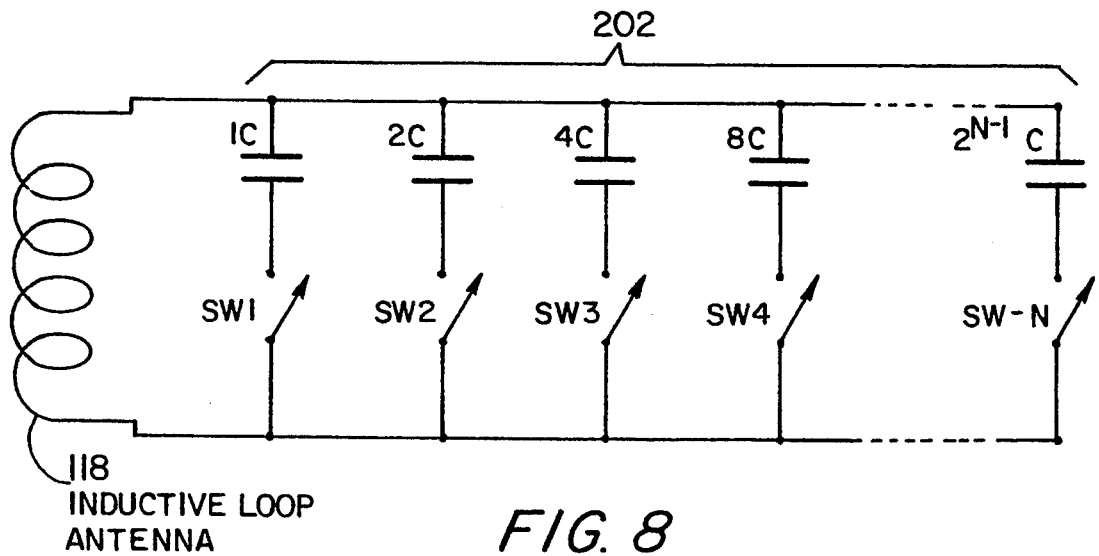
FIG. 8 is a schematic diagram of a tuning system by which a loop antenna may be kept resonant over a number of frequencies.

Referring now to FIGS. 7 and 8, the transmitter portion's antenna 118 employs a resonant loop design. Other antenna configurations are contemplated for use as part of the present invention, including resonant loaded linear radiators. However, for the illustrated resonant loop design, the physical size (8 feet square by 2 feet high, for example) and number of turns (for example, 11) are chosen to be capable of resonance at the highest frequency of interest (typically about 1-3 MHz or less for practical earth probing applications).

The "Q" factor is defined as the resonant center frequency divided by the 3 dB bandwidth. In a practical implementation of the invention, the Q has been measured to be in the range of 10 to 20, which limits the application to narrow band systems. However, in deep-earth probing radar applications, the percentage bandwidth may be 100 or greater. Thus the system is designed for repeated operation at a plurality of center frequencies.

The inventive system advantageously re-tunes the antenna 118 to so as track the instantaneous operating frequency of the radar transmitter. This is in contrast to conventional resistive swamping as a means of increasing antenna bandwidth. Resistive swamping greatly degrades the efficiency of the antenna system. However, by maintaining the high natural Q of the antenna in a manner provided by the present invention, the circulating current responsible for generating the radiated electromagnetic field is always a large multiple of the current introduced into the antenna by the radar transmitter. Generally, the circulating current equals Q times the transmitter feed current.

According to the present invention, the antenna is kept at resonance so that the circulating current equals Q times the transmitter feed current, independent of frequency. To achieve this effect, the antenna is re-tuned with each frequency change introduced by the transmitter. The antenna tuner unit 202, shown in FIG. 7, is controlled by the radar timing unit 203, which maintains antenna resonance at all times during the multi-frequency radar measurement interval.

Referring to FIG. 7, a radar timing unit 203, via path 203F, directs an exciter 204 to produce the desired output frequency in a sequence of stepped frequency modulated pulses. During interpulse periods (in which the output of transmitter 205 is suppressed), the radar timing unit 203 computes and transfers an antenna tuning command word on path 203A which corresponds to the next frequency to be generated.

In a preferred embodiment, the radar timing unit has a look-up table (LUT) programmed into it, the LUT associating a code word's bits with a particular transmission frequency. At the proper time, the radar timing unit commands the transmitter to produce a signal of the given frequency, while reading the corresponding LUT word and sending it to the tuning unit.

After settling of the antenna tuning unit 202, exciter 204 and transmitter 205 are enabled to apply full output power to the antenna 118 through the tuner 202. The radar timing unit 203, which may advantageously be implemented as part of a conventional digital computer 200, coordinates this sequence of events. The radar timing unit 203 also calculates the frequency-dependent antenna tuning command word, which is typically a digital control word used to selectively enable members of a set of reactive elements such as tuning capacitors, as described below.

An implementation of the FIG. 7 antenna tuning unit 202 is depicted in greater detail in FIG. 8. The antenna tuning circuit 202 is shown connected to loop antenna 118, which operates as the transmission antenna. Collectively, the antenna tuning unit 202 (when properly tuned) and the antenna 118 form a resonant circuit.

The illustrated antenna tuning unit 202 includes a bank of N capacitors which are selectively switched into and out of the resonant circuit by switches S1, S2, ..., SN. The positions of the switches are governed by bits of the control word generated by the radar timing unit 203 and passed to the antenna tuner on path 203A. The control word on path 203A may be a binary, Gray code, or other suitable code word. Each bit in the code word thus selects or deselects a corresponding capacitor in the parallel combination, so that the overall capacitance is determined by the values of the bits of the code word. The antenna resonant frequency is thus determined by the value of the code word's bits.

Advantageously, by providing capacitors having values $1C$, $2C$, $4C$, $8C$, ..., $2^{(N-1)}C$ (where C is the smallest required value of capacitance in shifting the antenna resonant frequency), all intermediate values of capacitance, in integral multiples of $1C$, can be obtained selecting an appropriate code word value. TABLE 3 is a listing of capacitor values used in the illustrated embodiment. As an example, selection of switches S1, S3, and S4, introduces a total capacitance of 130 pf into the antenna resonant circuit.

TABLE 3

| Exemplary Capacitor Values for Antenna Tuning Unit | | |
| --- | --- | --- |
| Control Switch Number | Capacitor Number | Value (pf) |
| SW 1 | 1C | 10 |
| SW 2 | 2C | 20 |
| SW 3 | 4C | 40 |
| SW 4 | 8C | 80 |
| SW 5 | 16C | 160 |
| . | | |
| . | | |

TABLE 3-continued

| Exemplary Capacitor Values for Antenna Tuning Unit | | |
| --- | --- | --- |
| Control Switch Number | Capacitor Number | Value (pf) |
| . | | |
| SW N | $2^{(N-1)}C$ | $10 \times 2^{(N-1)}$ |

Additional switches and capacitors may be added as required to lower the minimum operating frequency, in accordance with principles known to those skilled in the art. For example, the addition of two capacitors to the bank will reduce the lowest frequency by half, while maintaining a fine adjustment increment by means of the other capacitors in the bank.

Figure 9:
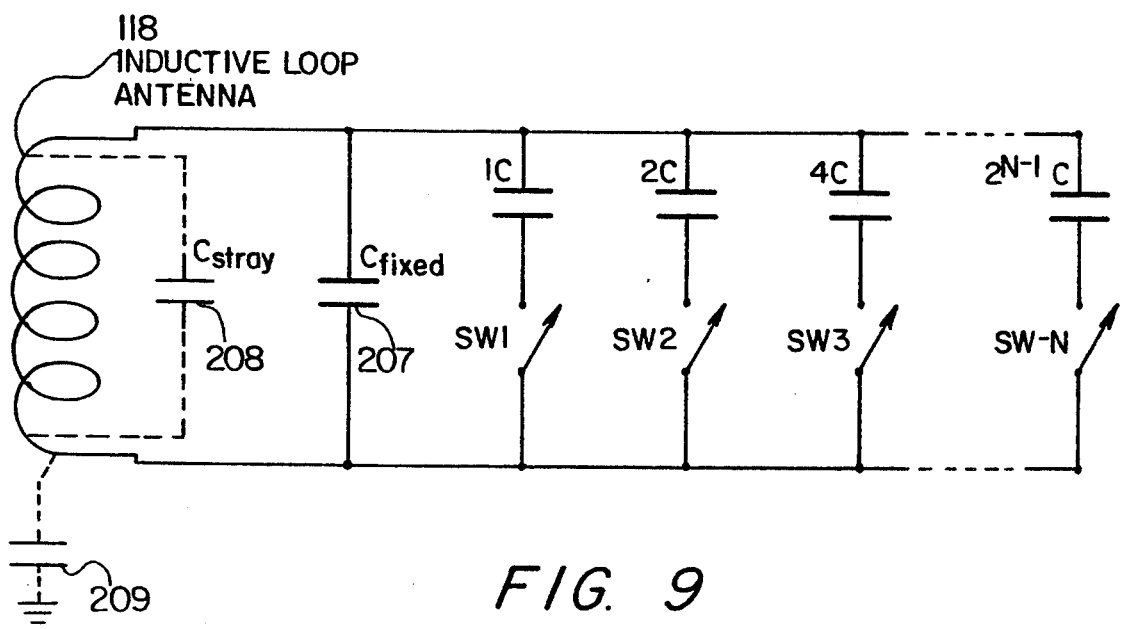
FIG. 9 is a schematic of the tuning system of FIG. 8, but further illustrating stray capacitance and the use of a fixed capacitor to set the maximum operating frequency.

Referring to FIG. 9, another practical consideration in the present invention is the stray capacitance of the loop antenna. The stray capacitance includes both capacitance 209 between the loop antenna and ground, and capacitance 208 between individual turns of the loop. FIG. 9 illustrates this effect, along with the introduction of a fixed capacitance 207 to intentionally set the maximum operating frequency.

The selecting control switches and capacitors must be rated to hold the full voltage across the antenna at the operating power level (often several kilovolts AC). The larger capacitors must be rated to carry a substantial portion of the antenna circulating current (often several amperes AC). These high values are a result of magnification by the Q-factor of the antenna system at resonance.

In operation, as the radar operating frequency is changed, the radar timing unit 203 communicates a corresponding code word to the antenna tuning unit 202 to maintain antenna resonance. A similar scheme may be implemented by switching inductance values into and out of a tuning circuit to adjust the antenna resonance, in a manner explained with reference to FIG. 14.

Figure 10:
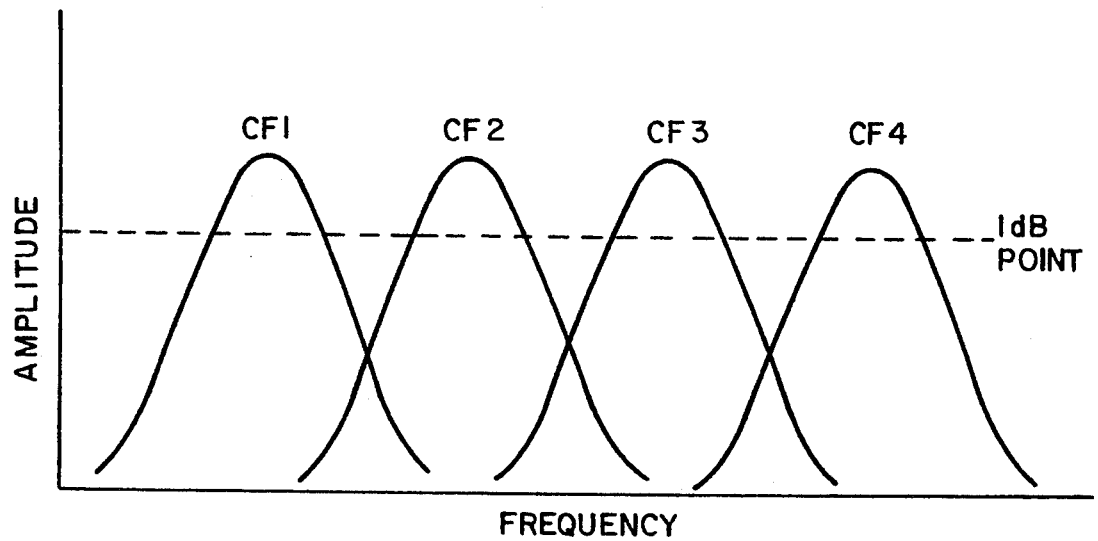
FIG. 10 illustrates multiple response curves that result when a number of transmitter frequency steps occur with corresponding changes in antenna resonance.

As the transmitter frequency is varied in accordance with the principles of FIGS. 1 and 2, the radar control unit 203 (FIG. 7) controls the antenna tuning unit 202 to tune to the appropriate resonant frequency. FIG. 10 illustrates a number of resonant tuning settings for the antenna, which are made to overlap at the 1 dB points (typical).

Figure 11:
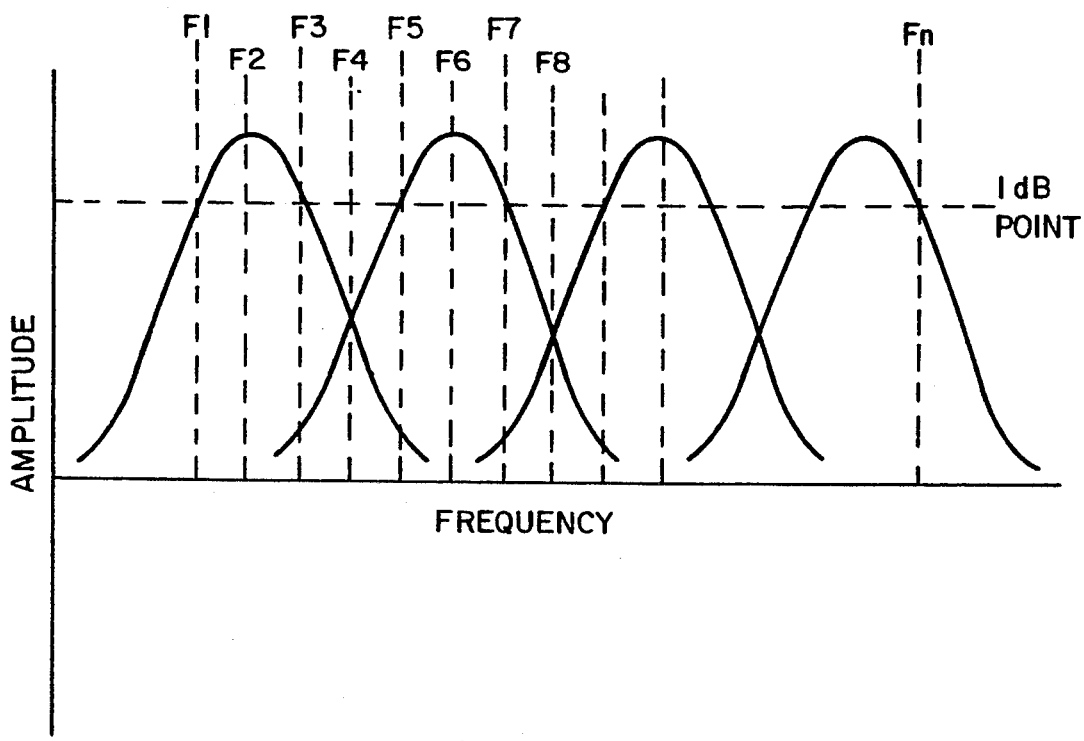
FIG. 11 emphasizes antenna response when several transmission frequencies occur within each antenna tuning interval.

Depending upon the Q of the antenna resonant circuit and the density of the transmitted frequency steps, several frequency steps may be included within the same antenna tuning interval, while remaining within 1 dB (or other specified tolerance) of the resonant peak response. These operating frequencies and antenna responses are illustrated in FIG. 11.

The antenna tuning unit 202 provides first order compensation of the antenna frequency response by adjusting its resonant frequency. This is required to improve its radiation power efficiency. However, a second level of compensation is also desirable for precise phase and amplitude measurements of subsurface phenomena.

A second level of compensation is desirable for a variety of reasons. Because the resonant compensation is achieved in steps, a residual control error will be present in the data. It is difficult to estimate the precise value of this error from sensing the phase of the transmitter output waveform alone. In addition, close proximity of the earth and nearby metal objects, as well as precipitation or condensation, introduce reactance into the tuned antenna, thereby changing its effective resonant frequency. Also, relocating the antenna in the process of conducting an electromagnetic survey will also subject it to a variety of local conditions and corresponding resonant offsets.

Figure 12:
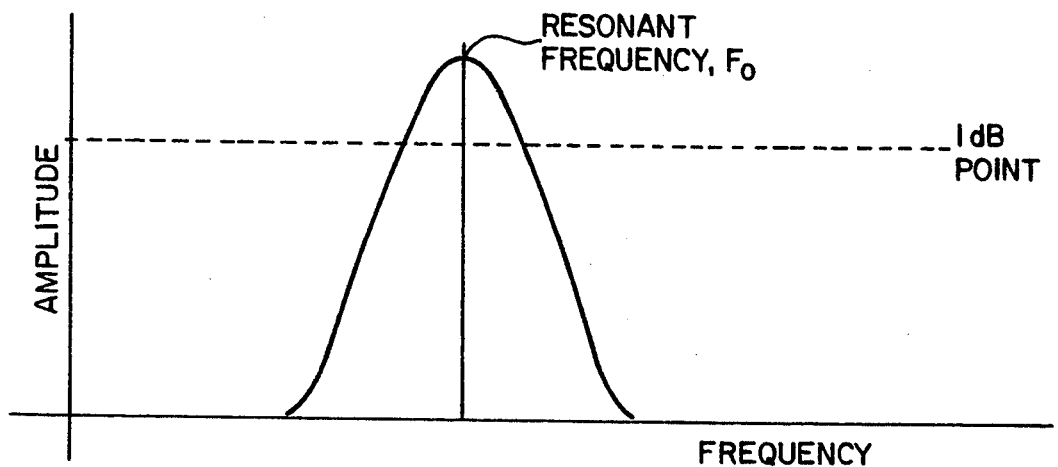
FIG. 12 illustrates signal amplitude as a function of the frequency of the antenna system, emphasizing the resonant frequency characteristics of the antenna.
Figure 13:
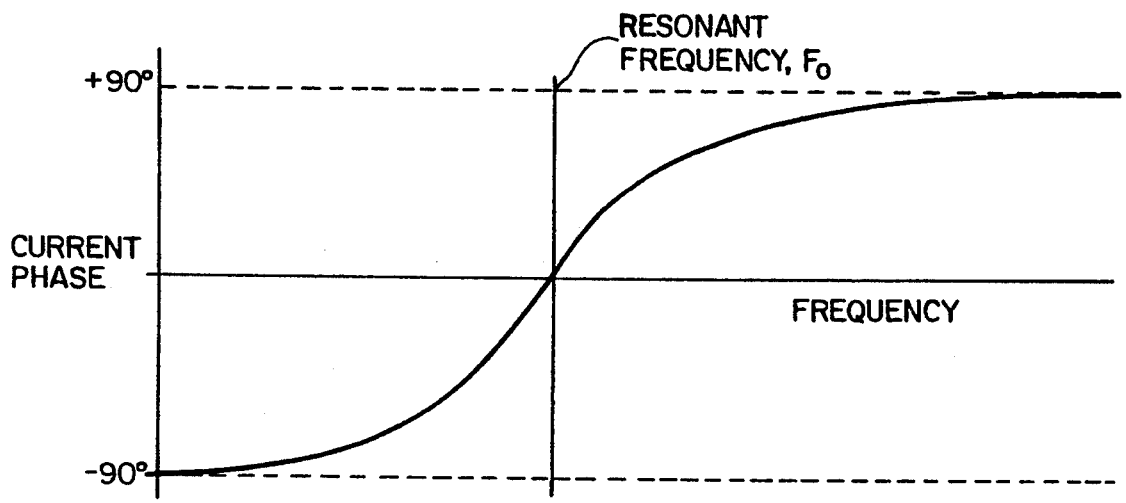
FIG. 13 shows current-to-voltage phase relation of the antenna system, as a function of frequency.

A unique and effective method of compensating for these errors is to monitor the radiated electromagnetic field using a small probe antenna (element 111' in FIG. 7) in close proximity to the main transmitting antenna 118. This probe antenna 111' detects the magnitude and phase of the radiated signal, which varies slightly over the resonant tuning range established at each given frequency setting of the antenna tuning unit 202. Typical off-resonant magnitude and phase response as a function of frequency are shown in FIGS. 12 and 13.

The output of probe antenna 111' may be digitized and recorded for data analysis, or used to adaptively control transmission power level and phase. In this manner, the present invention compensates for the many sources of magnitude and phase error found in conventional low frequency antenna systems, in order to maintain a highly uniform wideband frequency response.

Figure 14:
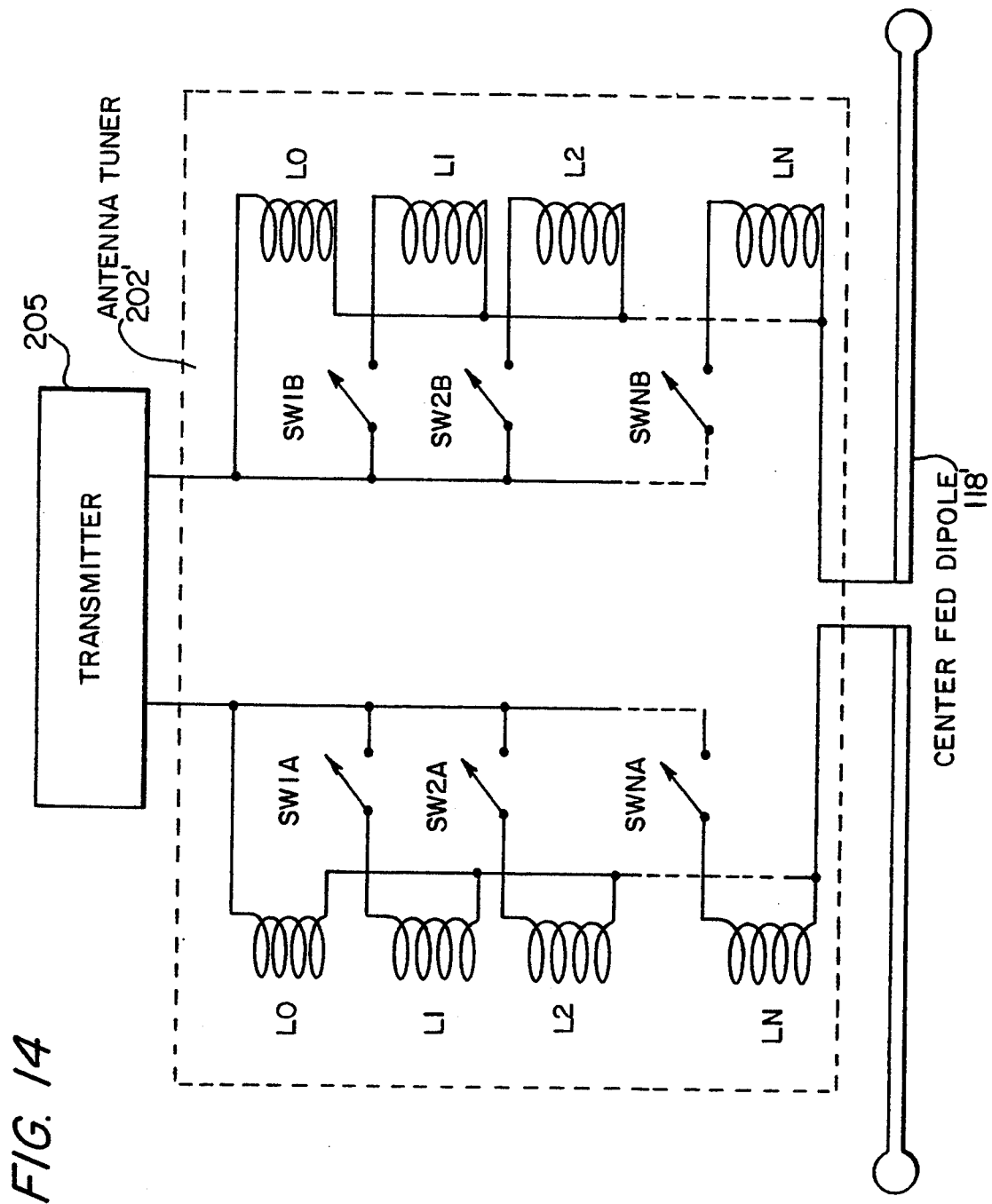
FIG. 14 is a block diagram of a second embodiment of the tuner, in which a center-fed dipole antenna is tuned by varying inductances.

The present invention envisions use of radiating elements other than the resonant loop structure of FIGS. 7 and 8. Referring to FIG. 14, a center-fed dipole element 118' is used in conjunction with an antenna tuning unit 202' located between it and the transmitter 205. At very low frequencies, the practical dipole length is usually limited to a small fraction of a wavelength. In this case, the antenna's close proximity to the ground improves the radiation efficiency by providing capacitive loading of the dipole elements. The antenna and tuner collectively form a resonant circuit which is resonated with programmably variable inductance.

FIG. 14 illustrates a preferred tuning unit for a center-fed dipole radiating element. There are two matching inductors selected by paired switches SW1a, SW1b; SW2a, SW2b; . . . ; SWNa, SWNb. Corresponding switches in the two switch banks are controlled by the same code word bit from the radar control unit 203 (FIG. 7). The matching inductors provide the same inductance to each side of the dipole radiator, in order to preserve the electrical center of the antenna at its feed point.

As illustrated, switches are in series with respective inductors, which are connected to the dipole antenna 118'. As in the loop antenna embodiment of FIGS. 7 and 8, repeated retuning of the dipole antenna's tuning unit 202' (FIG. 14) is synchronized with the transmitted frequency steps (FIG. 1). The inductors in antenna tuning unit 202' are placed in relation to their respective switches to switch them into and out of the resonant circuit, under control of the binary (or equivalent) code word from radar timing unit 203 (FIG. 7). The particular values of the illustrated inductors are:

L0, L1, L1/2, L1/4, L1/8, . . . , L1/[$2^{(n-1)}$]

where L0 represents the largest value of inductance required to tune the antenna to its lowest operating frequency, and N is the number of inductors provided in addition to L0. Particular inductance values are best chosen after empirical investigation, based on the particular embodiment, after initial choice based on basic resonant circuit theory. The first inductor, L0, is always placed in the circuit, and the remaining inductors L1 . . . LN are switched into the resonant circuit to raise its resonant frequency. The parallel combination of the switched inductors has a total inductance $L_T$ defined by:

$$L_T = \frac{L1}{b_1 + 2b_2 + \ldots + 2^{N-1}b_n}$$

where $b_1$ through $b_n$ designate code word bits from the radar timing unit.

The overall system and the transmission portion of the system having been described above, the reception portion of the system will now be described in greater detail.

Figure 15:
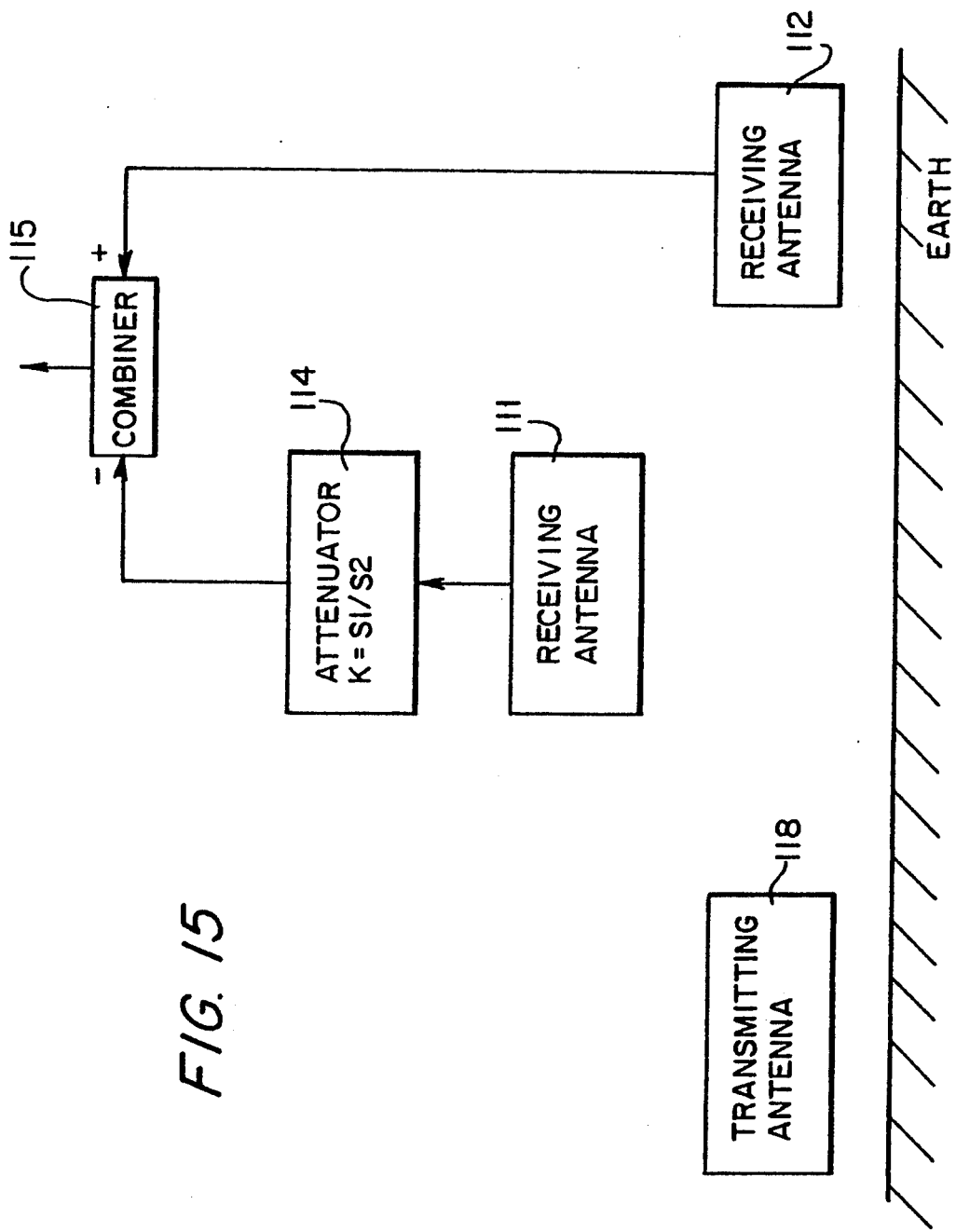
FIG. 15 is a block diagram illustrating the preferred two-antenna array of the receiving apparatus, shown with respect to the transmitter.

Referring now to FIG. 15, two receiving antennas 111 and 112 are placed at different distances from the transmitting antenna. Antenna 112 is positioned far from the transmitting antenna, limited by the maximum practical size of the radar probing system (typically about 30 feet). Antenna 111 is located much closer to the transmitting antenna 118, separated by approximately the radius of the transmitting antenna (typically about 3 feet). Thus, the direct path signal from the transmitter 118 to antenna 111 is at least ten times as large as that received at antenna 112 due to the difference in their respective proximity to the transmitting antenna.

The concept represented in FIG. 15 employs a dual antenna "spatial notching" design to suppress the receiver's direct path response from the transmitter. The signal from antenna 112 is combined with a signal from attenuator 114, the latter output being an attenuated version of the signal from antenna 111. The combined signal output from combiner (subtractor) 115 reflects application of the "spatial notching" feature of the present invention.

Figure 16:
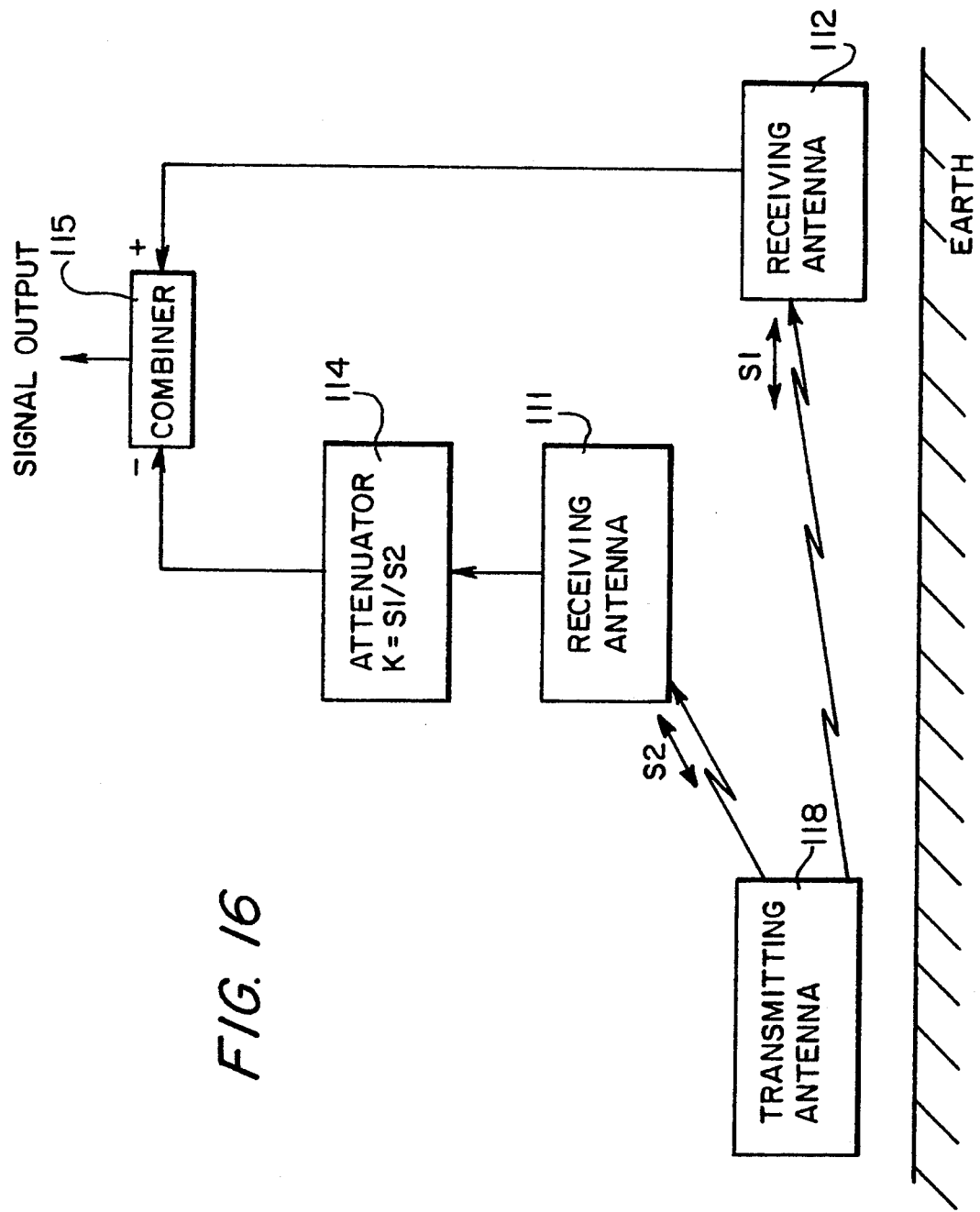
FIG. 16 is a block diagram showing undesired "direct reception" of transmitted signals by the two receiving antennas.

FIG. 16 illustrates the notching concept in more detail. By attenuating the signal received by antenna 111, and subtracting it from that received by antenna 112, the transmit direct path signal can be reduced to approximately zero (to within residual adjustment error). The attenuation in attenuator 114 is set to the ratio S1/S2 of the transmitter leakage signals received from the two antennas in such a way as to make the two signals equal at the inputs to the combiner 115. The combiner then performs a subtraction of these equal leakage signals. This substraction minimizes the resultant transmitter direct path signal as presented to the radar receiver.

Figure 17:
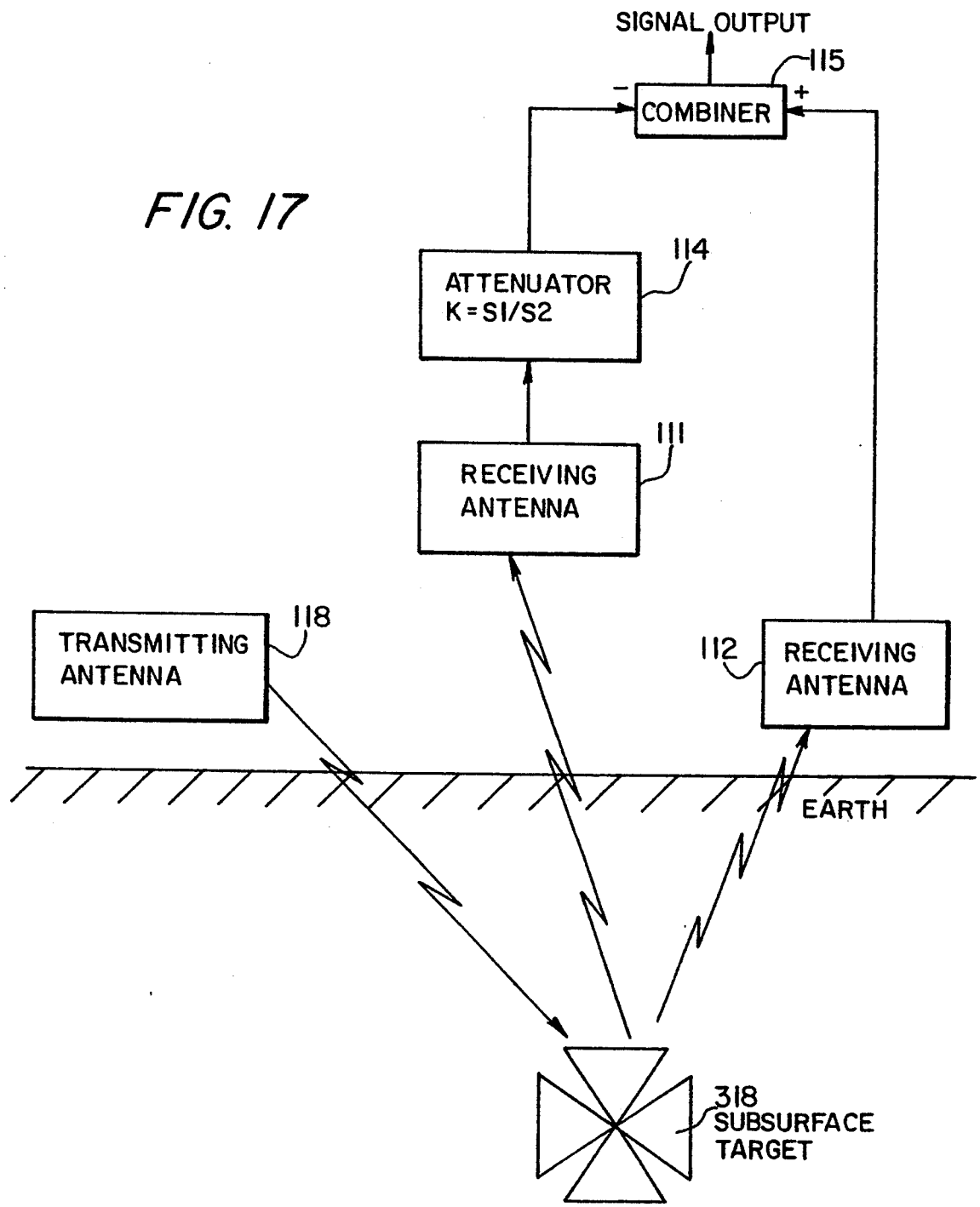
FIG. 17 is a block diagram illustrating reception of desired subsurface reflected signals.

FIG. 17 illustrates the effect of the spatial notching system on desired signals from beneath the surface of the earth.

Electromagnetic reflections from a subsurface target 318 are nearly equal as they arrive at the two receiving antennas 111, 112. This is due to the nearly equal path lengths travelled from the transmitting antenna, deep into the ground, and returning to emerge at the surface, and reaching the two receiving antennas. For example, if target 318 is 3,000 feet below the surface, the path lengths travelled to the two receiving antennas differ by much less than one percent. When the reflected signal received at antenna 111 is attenuated by attenuator 114, the resultant attenuated signal at the negative input to combiner 115 is much smaller than the signal received by antenna 112, which is not attenuated. Combiner 115 thus passes most of the desired (reflected) signal from receiving antenna 112 to the radar receiver. For the example cited above, nearly 90 percent of the desired (reflected) signal is preserved, while the undesired (direct) path signal from the transmitter is essentially eliminated. The performance gain expressed as a ratio of desired signal to leakage component is greater than 40 dB, corresponding to a signal loss of 0.5 dB and a direct path cancellation approaching 45 dB in actual field measurements. Thus, subsurface return signals are not significantly attenuated by the subtraction at the signal combiner 115 resulting in a high degree of sensitivity to these desired signals.

The attenuation value of attenuator 114 may be calculated from the receiver antennas' respective positions relative to the transmitter antenna 118. In practice, the calculated value serves as a design center value; the final value of attenuation is arrived at by measurement of actual received signals in the system. The attenuator is set to a value which provides maximum nulling of the measured transmitter direct path signal.

Figure 18:
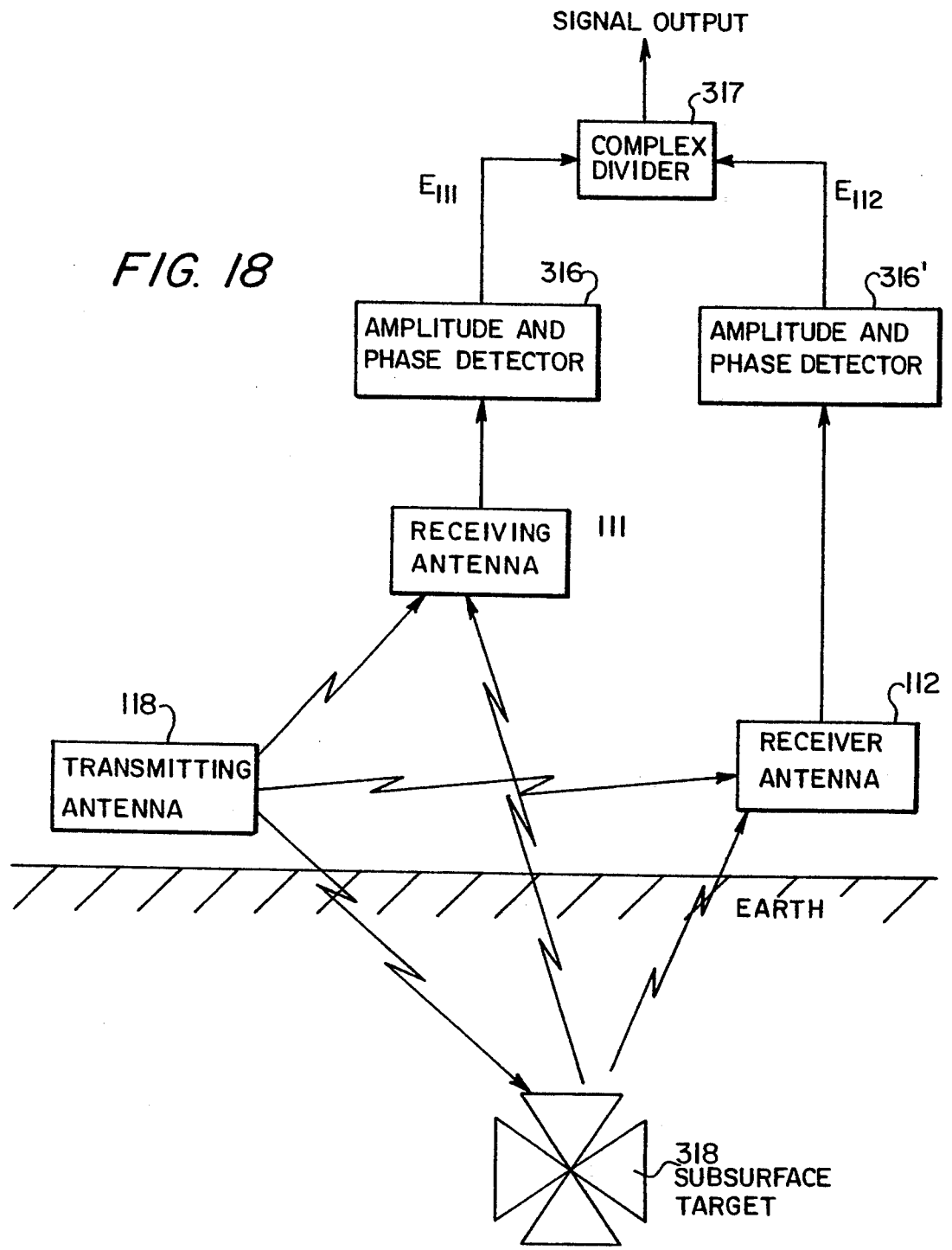
FIG. 18 is a block diagram illustrating simultaneous reception by the two receiving antennas of both direct and reflected signals from a transmitter, this embodiment of the receiving system including phase and amplitude detectors.

Referring now to FIG. 18, another feature of the present invention is its ability to compensate for frequency-dependent variation of gain or effective receiving aperture. This ability accommodates any factors which would vary the antenna's gain, such as proximity to the earth or to nearby metallic objects. In addition, this ability enables system operation under differing earth loading conditions of the receiving antennas which may be encountered at various probing locations.

The present invention compensates for the non-uniform gain factor by using the response at antenna 111 as a reference. In the typical case of a loop antenna, field strength E is given as:

$$E = \frac{377Ih}{\lambda D}$$

where:
E is the field strength in mv/m;
I is the antenna current, in amperes;
$\lambda$ is the wavelength in meters;
D is distance in kilometers; and
h is the antenna's effective height.

The antenna's effective height h in the above formula for the 20 loop is given by:

$$h = \frac{2\pi nA}{\lambda}$$

where:
n is the number of turns in the loop; and
A is the mean area per turn of the loop.

Combining the two relations, it is apparent that the field strength E varies inversely with the square of the wavelength, according to the relation:

$$E = \frac{754\pi nIA}{\lambda^2 D}$$

This relationship indicates the high dependency of field strength E on wavelength, and therefore on frequency.

With this in mind, the two-antenna system according to the present invention compensates for this frequency dependence, as well as for skin effect losses, phase perturbations caused by leakage inductance, stray capacitance in the individual antenna elements.

The embodiment shown in FIG. 18 utilizes two identical receiving antennas 111, 112, which exhibit the same amplitude and phase response. Antennas 111, 112 are connected to respective amplitude and phase detectors 316, 316', each of which converts the radio frequency signal to a complex number. In the preferred system, which is a stepped frequency modulated system, a complex number is obtained at each frequency step. The outputs of the phase detectors 316, 316' are input to a complex divider 317. Using this arrangement, the response of the monitor antenna 111 is measured, and its response is used to compensate the return from the main receiving antenna 112.

To appreciate the operation and advantages of this compensation method, it is first assumed that the receiving antennas are totally frequency-independent. Based on this assumption, the complex number derived from the signal received by the reference antenna 111 can be taken as unity (to within a complex scale factor), and the signal received from the main receiving antenna 112 includes complex returns from subsurface objects and features (in addition to a direct path component from the transmitter).

The frequency-dependent amplitude and phase variations received at the main receiving antenna 112 carry all the desired subsurface information. In the ideal case (in which antennas are frequency-independent), the main signal is scaled by unity at the complex divider, and the output of the divider contains the subsurface feature information.

As shown in FIG. 18, the detector output for antenna 112 is:

$$E_{112} = A_{112} e^{j\Phi 112}$$

where:
$A_{112}$ is the amplitude of the signal received at antenna 112;
e is the exponential function;
j is the square root of $-1$; and
$\Phi 112$ is the phase of the signal received at antenna 112.

Similarly, the detector output for antenna 111 is:

$$E_{111} = A_{111} e^{j\Phi 111}$$

where:
$A_{111}$ is the amplitude of the signal received at antenna 112;
e is the exponential function;
j is the square root of $-1$; and
$\Phi 111$ is the phase of the signal received at antenna 111;

These signals may exist in either analog or digital form, depending on the particular system implementation.

The output of the complex divider is given as:

$$E_{out} = \frac{E_{112}}{E_{111}} = \frac{A_{112}}{A_{111}} e^{j(\phi 112 - \phi 111)}$$

In the ideal case, where $E_{111}$ is simply a unity scale factor, the output of the complex divider is equal to the signal detected at the main antenna 112.

In practical cases, where the antennas are not frequency-independent, subsurface returns cannot be distinguished from non-uniformities in the complex antenna response, when using only one receiving antenna. This is a severe limitation of most known low frequency radar systems, since it is nearly impossible to construct frequency-independent antennas at low frequencies. However, by using two identical antennas, as in the configuration shown in FIG. 18, the desired information can be extracted. Since the signal from the reference antenna 111 contains mostly direct path energy from the transmitter, its signal is converted to a complex scale factor which varies in amplitude and phase mostly as a result of the antenna frequency response, and to a much lesser extent due to subsurface returns. Thus, departures from unity, as in the ideal frequency independent antenna, provide a compensation factor for the subsurface returns received by the main antenna 112.

When the signals detected from the main antenna 112 are divided by this complex, frequency-dependent scale factor, the result at the output of complex divider 317 is approximately equal to the output which would have been ideally achieved. If the receiving response is large, so that the complex scale factor is increased, the output of the divider is reduced. Conversely, if the antenna response is diminished, a smaller scale factor is automatically used, equalizing the output of the divider.

Compensation for the phase factor is achieved in much the same way as it is achieved for magnitude. The phase of the complex divider output is the difference between the two antenna phases. Thus, the common, nonuniform phase response of the two receiving antennas is subtracted out, leaving the phase perturbations introduced by the subsurface returns.

An additional feature of the automatic antenna amplitude and phase compensation method is its ability to also remove transmitter gain variations. Since the transmitter antenna response appears equally in both signals E112 and E111 as a multiplying factor, the transmitter's variations are divided out, and thus compensated for, by the complex divider 317 shown in FIG. 18. Thus, advantageously, it is not necessary that the transmitter antenna be designed for frequency independence.

In the deep probing radar system, the transmitter antenna is tuned to each radiated frequency to achieve maximum radiation efficiency. Advantageously, when using the two-antenna receiving system of FIG. 18, it is not necessary that the tuned response be identical at all frequencies. In fact, the transmitter antenna may be coarsely tuned; the fine gain amplitude and frequency variations are rejected by the complex divider 317. This arrangement provides a practical system which can operate under adverse conditions of temperature, humidity, and vibration.

Figure 19:
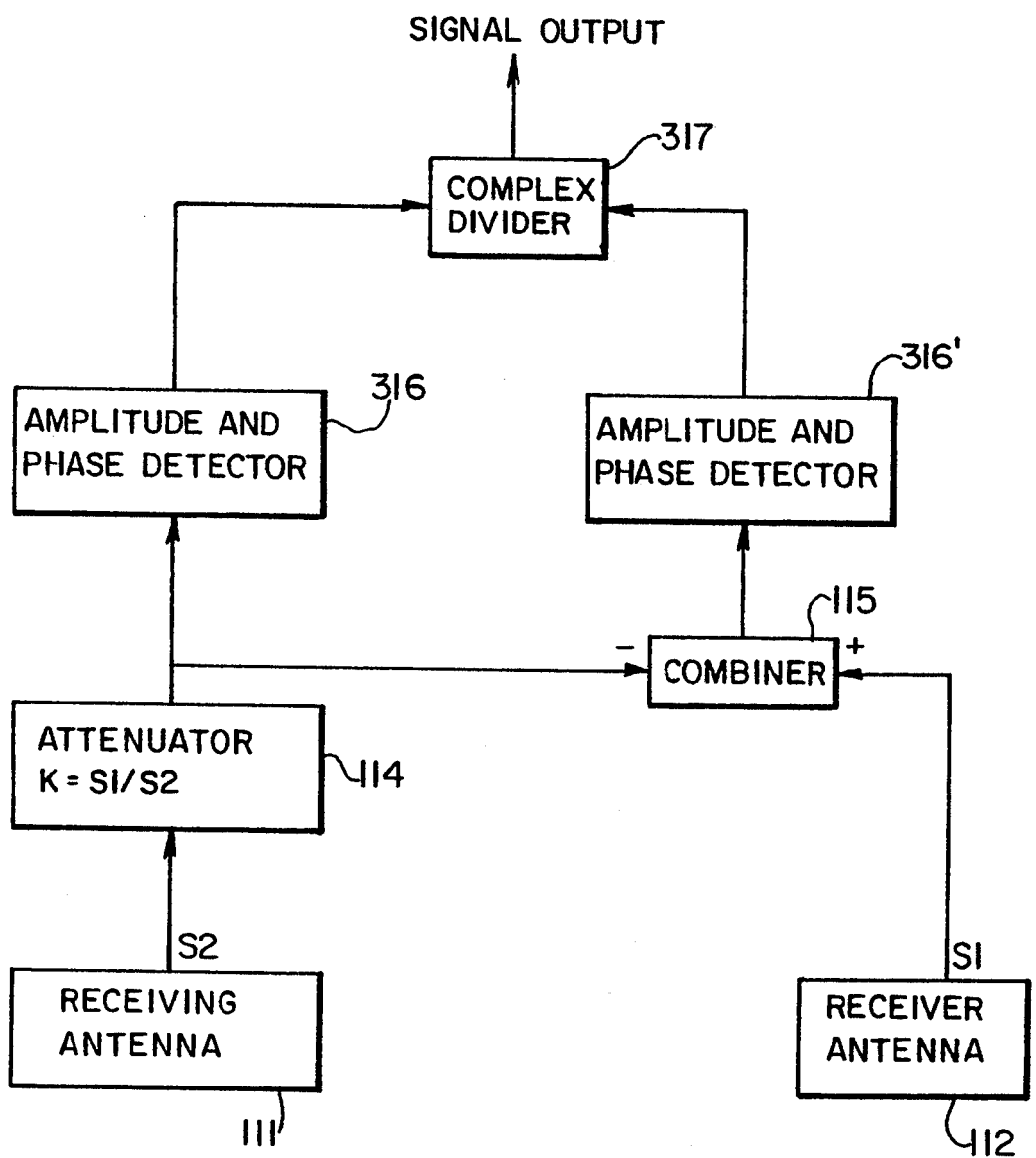
FIG. 19 is a block diagram of an embodiment of the invention which incorporates features of both embodiments of FIGS. 17 and 18.

Referring now to FIG. 19, the dual antenna configuration can be used to simultaneously perform both "spatial notching" of the transmitter direct path signal (as in FIG. 17) and gain compensation (as in FIG. 18).

In FIG. 19, the signal from receiving antenna 112 is first subtracted (in combiner 115) from the attenuated version of the signal from receiving antenna 111 to obtain a combiner output signal essentially free of the transmitted direct-path energy. The resultant output of combiner 115 is detected by the amplitude and phase detector 316', whose output is presented to the complex divider 317. The attenuated signal from antenna 111 is detected at 316 and used as the divisor (reference) input to the complex divider 317.

The FIG. 19 configuration provides an output from the complex divider which is both (1) free of direct path transmitted energy so as to be maximally sensitive to subsurface returns, and (2) compensated for frequency-dependent non-uniformities of both transmitter and receiver antennas.

As described above, calibration data may be used to achieve phase and amplitude control of the radiated energy. This data is available from antenna 111 for use by the transmitting system, in addition to the receiving system as described herein. Thus, the probe antenna 111' (FIG. 7) may be the same as receiving antenna 111.

Modifications and variations of the above-described embodiments of the present invention are possible, as appreciated by those skilled in the art in light of the above teachings. For example, it will be apparent to those skilled in the art that the present invention may employ any type of receiving antenna element, such as a loop, long wire, dipole, discone, helical, log periodic, rhombic, ferrite or dielectric-loaded configuration. The attenuator, combiner, detectors, and complex divider may be implemented in analog or digital form, or as a hybrid combination of these technologies. A suitable arrangement places the analog to digital converter immediately before the amplitude and phase detectors, which increases the dynamic range for a given converter bit size by at least 40 dB. This is the result of reduction in the relatively large transmitter direct path signal by the present invention. It is therefore to be understood that, within the scope of the appended claims and their equivalents, the invention may be practiced otherwise than as specifically described.

What is claimed is:

1. A system for earth exploration by generating and radiating low frequency electromagnetic energy deeply into the earth and analyzing return information, the system comprising:
   a) means for generating a series of pulsed electromagnetic signals in a low frequency range less than about 3 Megahertz, so as to form a series of electromagnetic pulses having respective spectra which collectively cover a portion of the low frequency range that is substantially larger than any individual pulse's spectrum;
   b) means for radiating the electromagnetic pulses into the earth, so as to penetrate the earth to substantial depths;
   c) means for detecting electromagnetic reflections from subsurface layers or objects; and
   d) means for extracting deep subsurface return information from the electromagnetic reflections.

2. The system of claim 1, wherein the extracting means includes:
   means for removing system distortions such as detecting-device bias and compensation errors.

3. The system of claim 1, wherein the generating means constitutes means for generating electromagnetic energy in a series of pulsed electromagnetic signals having frequencies in a range from 0.3 to 3,000 Kilohertz.

4. The system of claim 1, wherein the generating means constitutes means for generating electromagnetic energy in a series of pulses having energies in excess of 300,000 joules per sounding, each sounding corresponding to the series of electromagnetic pulses.

5. The system of claim 1, wherein:
   a) the means for detecting includes:
      1) a first receiving antenna; and
      2) a second receiving antenna;
   b) the extracting means includes means for automatically compensating for direct leakage from the generating means by using a spatial notching technique, the compensating means including a combiner, responsive to signals received by the first and second antennas;
   c) the first and second receiving antennas are positioned relative to the generating means so that the combiner combines (1) attenuated versions of direct signals received by the first receiving antenna with (2) signals derived from those signals received by the second receiving antenna; and d) the combiner cancels portions of the signals received by the second receiving antenna that are due to direct transmission from the generating means.

6. The system of claim 1, wherein the extracting means includes means for switching automatically between:
(1) a DC bias adjustment position, in which reflection signals are gated off; and
(2) a long time integration position, in which the reflection signals are gated on for removal of interference that would otherwise mask weak return information signals.

7. The system of claim 1, wherein the extracting means includes:
means for integrating a signal derived from the electromagnetic reflections during a pulse period, so as to remove interference that would otherwise mask weak return information signals.

8. The system of claim 5, wherein the extracting means further includes:
vector calibration and error removal means for (1) determining a reference vector derived from signals from the first receiving antenna, and (2) removing phase and amplitude error from a signal derived from signals from the second receiving antenna by using vector operations.

9. The system of claim 1, wherein the extracting means includes:
means for applying a low side-lobe weighting function to a signal derived from the electromagnetic reflections, so as to allow extraction of weak subsurface return information even in the presence of strong surface or subsurface reflections.

10. The system of claim 1, wherein the extracting means includes:
means for applying an Inverse Fast Fourier Transform so as to convert signals derived from the electromagnetic reflections to corresponding depth signals.

11. The system of claim 1, wherein the extracting means includes:
means for applying a depth sensitivity compensation function so as to compensate for reduced-magnitude signals reflected from deeper subsurface layers or objects.

12. The system of claim 1, further comprising:
a recorder means for obtaining depth profiles and a stacking arrangement, so as to form three-dimensional images of subsurface structures.

13. The system of claim 1, further comprising:
means for displaying depth images of subsurface structures.

14. A deep probing radar generating and radiating system for use in obtaining reflected signal data to permit mapping of layers or objects beneath the surface of the earth or other media, the system comprising:

a) means for generating pulses of high power electromagnetic waves of various respective frequencies, each frequency being in a low frequency range of less than about 3 MHz;
b) a transmitting antenna which is small in comparison to the electromagnetic waves' wavelengths, the transmitting antenna responsive to the generating means to radiate the pulses of electromagnetic waves deeply into the earth or other media;
c) timing means for controlling the frequency of the waves generated by the generating means so as to cause respective frequency spectra of the pulses to collectively cover a substantial percentage of the low frequency range; and
d) means for tuning the transmitting antenna to resonance in response to a control signal from the timing means so as to generate the high power pulses, the control signal changing between at least some of the pulses.

15. The system of claim 14 wherein the generating means includes:
a variable frequency power source connected to drive the transmitting antenna through the tuning means.

16. The system of claim 14 wherein the tuning means includes:
plural means for switching a corresponding plurality of reactive circuit elements into and out of a circuit so as to alter the antenna circuit's resonant frequency to match the frequency of the pulses of electromagnetic waves, the switching means being controlled by the control signal from the timing means.

17. The system of claim 16, wherein:
the control signal is a binary word having a plurality of bits; and
the switching means constitute a number of switches arranged with respect to the corresponding reactive circuit elements so as to selectively switch each corresponding reactive circuit element into and out of the circuit in accordance with respective bits from the binary word.

18. The system of claim 17, wherein the reactive circuit elements are capacitors.

19. The system of claim 18, wherein:
there are N capacitors having values C, 2C, ... $2^{(N-1)}C$, so that an aggregate capacitance of any integral multiple of a single capacitance C can be achieved by selectively switching the capacitors into and out of the circuit.

20. The system of claim 17, wherein the reactive circuit elements are inductors.

21. The system of claim 20, wherein:
there are N inductors having values L, L/2, ... $L/2^{(N-1)}$, so that an aggregate inductance, L divided by any integer through N−1, can be formed by selectively switching the inductors into and out of the circuit.

22. The system of claim 14, wherein the transmitting antenna is a loop antenna.

23. The system of claim 14, wherein the transmitting antenna is a dipole antenna.

24. The system of claim 14, wherein the timing means includes means for synchronizing operations of:
(1) changing the frequency of the pulsed signals generated by the generating means; with
(2) sending of control signals to the tuning means.

25. The system of claim 14, wherein the timing means includes means for controlling the generating means to generate a series of pulses of consecutively higher frequency within the frequency range.

26. The system of claim 14, further comprising:
means for monitoring the amplitude and phase of the electromagnetic waves radiated from the antenna, so as to allow compensating for deviations in frequency, spurious signals and noise.

27. The system of claim 26, wherein the monitoring means includes:
a second antenna located physically close to the transmitting antenna.

28. The system of claim 26, further comprising:
a processing means for receiving a signal from the monitoring means and causing the timing means to alter operating parameters of the generating means.

29. A receiver subsystem for use in a system for earth probing having a transmitting antenna, the receiver comprising:
a) first and second receiving antennas for producing respective first and second antenna output signals, the first receiving antenna positioned much closer to the transmitting antenna than the second receiving antenna;
b) means for attenuating the first antenna output signal to produce an attenuated signal; and
c) means for combining signals derived from the attenuated signal and the second antenna output signal, so as to substantially remove signal components from the second antenna output signal that are caused by direct signal transmission from the transmitting antenna.

30. The subsystem of claim 29, wherein the combining means includes a subtractor means for subtracting the attenuated signal from the second antenna output signal.

31. A receiver subsystem for use in a system for earth probing having a transmitter driving a transmitting antenna at a band of frequencies, the receiver comprising:
a) first and second receiving antennas for producing respective first and second antenna output signals, the first receiving antenna positioned much closer to the transmitting antenna than the second antenna;
b) first and second amplitude and phase detectors, connected to receive the respective first and second antenna output signals and provide respective first and second detector outputs expressed as respective first and second complex numbers; and
c) means for dividing the second complex number by the first complex number to provide a quotient complex number which contains accurate information regarding subsurface reflections of transmitted energy but is compensated for frequency-dependent amplitude and phase variations of the transmitter, variations in earth loading and changes in antenna operating height above the ground.

32. A receiver subsystem for use in a system for earth probing having a transmitter and an associated transmitting antenna, the receiver comprising:
a) first and second receiving antennas for producing respective first and second antenna output signals, the first receiving antenna positioned much closer to the transmitting antenna than the second receiving antenna;
b) means for attenuating the first antenna output signal to produce an attenuated signal;
c) means for combining signals derived from the attenuated signal and the second antenna output signal, so as to substantially remove signal components from the second antenna output signal that are caused by direct signal transmission from the transmitting antenna, the combining means providing a combiner output;
d) first and second amplitude and phase detectors, connected to receive the combiner output and the attenuator output, respectively, and provide respective first and second detector outputs expressed as respective first and second complex numbers; and
e) means for dividing the second complex number by the first complex number to provide a quotient complex number which contains accurate information regarding subsurface reflections of transmitted energy but is compensated for frequency-dependent amplitude and phase variations of the transmitter, variations in earth loading and changes in antenna operating height above the ground.

33. The subsystem of claim 32, wherein the combining means includes a subtractor means for subtracting the attenuated signal from the second antenna output signal.

34. The subsystem of claim 32, further comprising:
processing means for receiving a signal from the first antenna so as to allow the processor means to control the transmitter's amplitude and phase.

* * * * *